United States Patent
Lee

(10) Patent No.: US 9,543,952 B2
(45) Date of Patent: Jan. 10, 2017

(54) SEMICONDUCTOR MEMORY DEVICE AND A METHOD OF OPERATING THE SAME

(71) Applicant: Samsung Electronics Co., Ltd., Suwon-si, Gyeonggi-do (KR)

(72) Inventor: Ki Won Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 127 days.

(21) Appl. No.: 14/460,764

(22) Filed: Aug. 15, 2014

(65) Prior Publication Data

US 2015/0115999 A1    Apr. 30, 2015

(30) Foreign Application Priority Data

Oct. 29, 2013  (KR) .................. 10-2013-0129574

(51) Int. Cl.
| | |
|---|---|
| H03K 19/0175 | (2006.01) |
| H03K 19/003 | (2006.01) |
| G11C 7/02 | (2006.01) |
| G11C 7/10 | (2006.01) |
| G11C 11/4096 | (2006.01) |
| G11C 5/04 | (2006.01) |
| G11C 29/02 | (2006.01) |

(52) U.S. Cl.
CPC ......... *H03K 19/017545* (2013.01); *G11C 5/04* (2013.01); *G11C 7/02* (2013.01); *G11C 7/1069* (2013.01); *G11C 11/4096* (2013.01); *G11C 29/021* (2013.01); *G11C 29/028* (2013.01); *H03K 19/00315* (2013.01); *G11C 2207/105* (2013.01)

(58) Field of Classification Search
None
See application file for complete search history.

(56) References Cited

U.S. PATENT DOCUMENTS

| | | | |
|---|---|---|---|
| 6,313,670 B1 | 11/2001 | Song et al. | |
| 6,636,821 B2 | 10/2003 | Lawson | |
| 7,162,376 B2* | 1/2007 | Oh | G11C 5/147 365/189.09 |
| 7,269,043 B2* | 9/2007 | Lee | G11C 5/04 365/201 |
| 7,312,629 B2 | 12/2007 | Huang et al. | |
| 7,408,379 B2* | 8/2008 | Cho | G11C 29/028 326/30 |

(Continued)

FOREIGN PATENT DOCUMENTS

| | | |
|---|---|---|
| JP | 2010-178094 | 8/2010 |
| KR | 1020050073982 | 7/2005 |
| KR | 1020100053154 | 5/2010 |

*Primary Examiner* — Alexander H Taningco
*Assistant Examiner* — Nelson Correa
(74) *Attorney, Agent, or Firm* — F. Chau & Associates, LLC

(57) ABSTRACT

A semiconductor memory device includes a ZQ calibration unit configured to generate an output high level voltage (VOH) code according to a VOH control code obtained from a result of comparing a reference voltage with a first VOH; and an output driver configured to generate a data signal having a second VOH determined by the VOH code. The VOH control code includes a pull-up VOH control code and a pull-down VOH control code and the VOH code includes a pull-up VOH code and a pull-down VOH code.

13 Claims, 21 Drawing Sheets

(56) References Cited

U.S. PATENT DOCUMENTS

| | | | |
|---|---|---|---|
| 7,514,954 B2* | 4/2009 | Kim | G11C 7/1051 |
| | | | 326/30 |
| 7,528,626 B2* | 5/2009 | Kim | H03K 19/0005 |
| | | | 326/30 |
| 7,557,603 B2* | 7/2009 | Pan | H03K 19/0005 |
| | | | 326/30 |
| 7,642,808 B2* | 1/2010 | Jeong | H04L 25/028 |
| | | | 326/26 |
| 7,834,654 B2 | 11/2010 | Millar | |
| 7,853,842 B2* | 12/2010 | Kim | G11C 5/063 |
| | | | 324/601 |
| 7,952,382 B2 | 5/2011 | Moon | |
| 7,978,546 B2* | 7/2011 | Lee | G06F 13/4239 |
| | | | 365/189.07 |
| 7,996,590 B2* | 8/2011 | Lee | G11C 5/04 |
| | | | 326/30 |
| 2013/0088257 A1 | 4/2013 | Hara | |
| 2015/0348603 A1* | 12/2015 | Lee | H03K 19/0005 |
| | | | 365/189.07 |

* cited by examiner

SEMICONDUCTOR MEMORY DEVICE AND A METHOD OF OPERATING THE SAME

CROSS-REFERENCE TO RELATED APPLICATION

This application claims priority under 35 U.S.C. §119(a) to Korean Patent Application No. 10-2013-0129574 filed on Oct. 29, 2013, the disclosure of which is incorporated by reference herein in its entirety.

TECHNICAL FIELD

The inventive concept relates to a semiconductor memory device and a method of operating the same, and more particularly, to a semiconductor memory device for providing high-reliability data transmission and a method of operating the same.

DISCUSSION OF THE RELATED ART

A semiconductor memory device may communicate commands and data with an external system such as a memory controller. When the impedance of a bus line connecting the semiconductor memory device and the external system is different from that of a signal line directly connected to the bus line within the semiconductor memory device, data reflection may occur. To reduce data reflection in high-speed semiconductor memory devices, a device, e.g., an on-die termination (ODT), may be provided for impedance matching.

SUMMARY

According to an exemplary embodiment of the inventive concept, there is provided a semiconductor memory device including a ZQ calibration unit configured to generate an output high level voltage (VOH) code according to a VOH control code obtained from a result of comparing a reference voltage with a first VOH; and an output driver configured to generate a data signal having a second VOH determined by the VOH code. The VOH control code may include a pull-up VOH control code and a pull-down VOH control code and the VOH code may include a pull-up VOH code and a pull-down VOH code.

The ZQ calibration unit may include a first calibration unit configured to generate the pull-up VOH code, which determines a current generated by a pull-up driver included in the output driver, based on a first target VOH determined by the pull-up VOH control code; and a second calibration unit configured to generate the pull-down VOH code, which determines a resistance of a pull-down driver included in the output driver, based on a second target VOH determined by the pull-down VOH control code.

The first calibration unit may include a pull-up VOH control block configured to generate the first target VOH, a first comparator configured to output a first comparison result by comparing the first target VOH with a voltage of a first node, a first code generator configured to generate the pull-up VOH code based on the first comparison result, a replica pull-up driver configured to generate a first current flowing across the first node according to the pull-up VOH code, and a replica system on chip (SOC) on die termination (ODT) resistor configured to determine the voltage of the first node according to the first current.

The second calibration unit may include a pull-down VOH control block configured to generate the second target VOH, a second comparator configured to output a second comparison result by comparing the second target VOH with a voltage of a second node, a second code generator configured to generate the pull-down VOH code based on the second comparison result, and a replica pull-down driver configured to determine the voltage of the second node according to the pull-down VOH code.

The replica SOC ODT resistor may have a resistance determined by the pull-down VOH code.

The voltage of the second node may be determined by a resistor outside the semiconductor memory device and the replica pull-down driver.

The VOH control code may be generated by an internal test mode signal of the semiconductor memory device or a VOH change request signal provided from outside the semiconductor memory device.

The semiconductor memory device may further include a pre-driver configured to generate a pull-up driving signal and a pull-down driving signal according to the VOH code and internal data. The output driver may include the pull-up driver configured to generate a current determined by the pull-up driving signal and the pull-down driver configured to have a resistance determined by the pull-down driving signal.

According to an exemplary embodiment of the inventive concept, there is provided a method of operating a semiconductor memory device. The method includes generating a VOH code according to a VOH control code obtained from a result of comparing a reference voltage with a first VOH and generating a data signal having a second VOH determined by the VOH code. The VOH control code may include a pull-up VOH control code and a pull-down VOH control code and the VOH code may include a pull-up VOH code and a pull-down VOH code.

Generating the VOH code may include generating the pull-up VOH code, which determines a current generated by a pull-up driver included in an output driver, based on a first target VOH determined by the pull-up VOH control code; and generating the pull-down VOH code, which determines a resistance of a pull-down driver included in the output driver, based on a second target VOH determined by the pull-down VOH control code.

Generating the pull-up VOH code may include generating the first target VOH, outputting a first comparison result by comparing the first target VOH with a voltage of a first node, generating the pull-up VOH code based on the first comparison result, generating a first current flowing across the first node according to the pull-up VOH code, and determining the voltage of the first node according to the first current.

Generating the pull-down VOH code may include generating the second target VOH, outputting a second comparison result by comparing the second target VOH with a voltage of a second node, generating the pull-down VOH code based on the second comparison result, and determining the voltage of the second node according to the pull-down VOH code.

A replica SOC ODT resistor may be used to determine the voltage of the first node according to the first current and have a resistance determined by the pull-down VOH code.

The voltage of the second node may be determined by a resistor outside the semiconductor memory device and a replica pull-down driver.

The VOH control code may be generated by an internal test mode signal of the semiconductor memory device or a VOH change request signal provided from outside the semiconductor memory device.

According to an exemplary embodiment of the inventive concept, there is provided a semiconductor memory device including: a data output circuit configured to perform ZQ calibration according to an output high level voltage (VOH) change request signal or a test mode signal and output a data signal whose VOH has been changed, the data output circuit including a ZQ calibration control unit configured to generate a VOH control code corresponding to information of the VOH change request signal or the test mode signal, the information indicating whether to increase or decrease the VOH.

The data signal may be output from a DQ terminal.

The VOH change request signal is generated by a memory controller configured to receive the data signal output from the DQ terminal.

The data output circuit may further include a ZQ calibration unit configured to generate a pull-up VOH code or a pull-down VOH code in response to the VOH control code.

The data output circuit may further include a pre-driver configured to generate a pull-up driving signal and a pull-down driving signal in response to the pull-up VOH code, the pull-down VOH code and data.

BRIEF DESCRIPTION OF THE DRAWINGS

The above and other features of the inventive concept will become more apparent by describing in detail exemplary embodiments thereof with reference to the attached drawings in which.

DETAILED DESCRIPTION OF THE EMBODIMENTS

Figure 1:
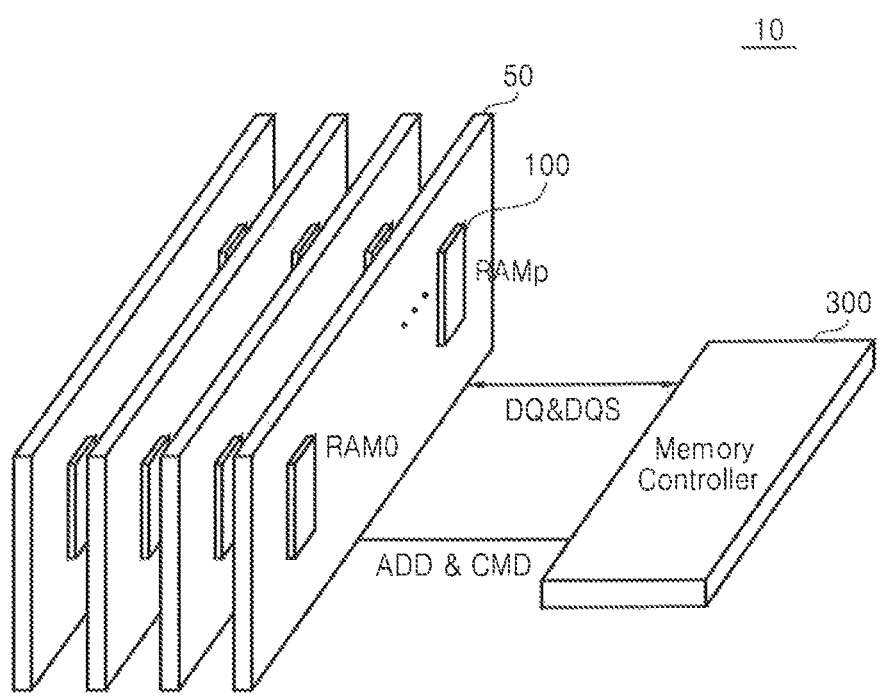
FIG. 1 is a schematic diagram of a memory system according to an exemplary embodiment of the inventive concept.

The inventive concept now will be described more fully hereinafter with reference to the accompanying drawings, in which exemplary embodiments are shown. This inventive concept may, however, be embodied in many different forms and should not be construed as limited to the embodiments set forth herein. In the drawings, the size and relative sizes of layers and regions may be exaggerated for clarity. Like numbers may refer to like elements throughout the application.

It will be understood that when an element is referred to as being "connected" or "coupled" to another element, it can be directly connected or coupled to the other element or intervening elements may be present.

As used herein, the singular forms "a", "an" and "the" are intended to include the plural forms as well, unless the context clearly indicates otherwise.

FIG. 1 is a schematic diagram of a memory system 10 according to an exemplary embodiment of the inventive concept. The memory system 10 may include a memory module 50 and a memory controller 300.

The memory module 50 may include a plurality of dies RAM0 through RAMp each of which corresponds to a semiconductor memory device. The memory module 50 may be a single in-line memory module (SIMM) or a dual in-line memory module (DIMM).

The dies RAM0 through RAMp may operate in response to address information ADD and a command signal CMD received from the memory controller 300 and communicate a data signal DQ and a data strobe signal DQS with the memory controller 300. The memory controller 300 may control the overall operation, e.g., a read, write or refresh operation of the memory module 50, and may be a part of a system on chip (SoC).

Figure 2:
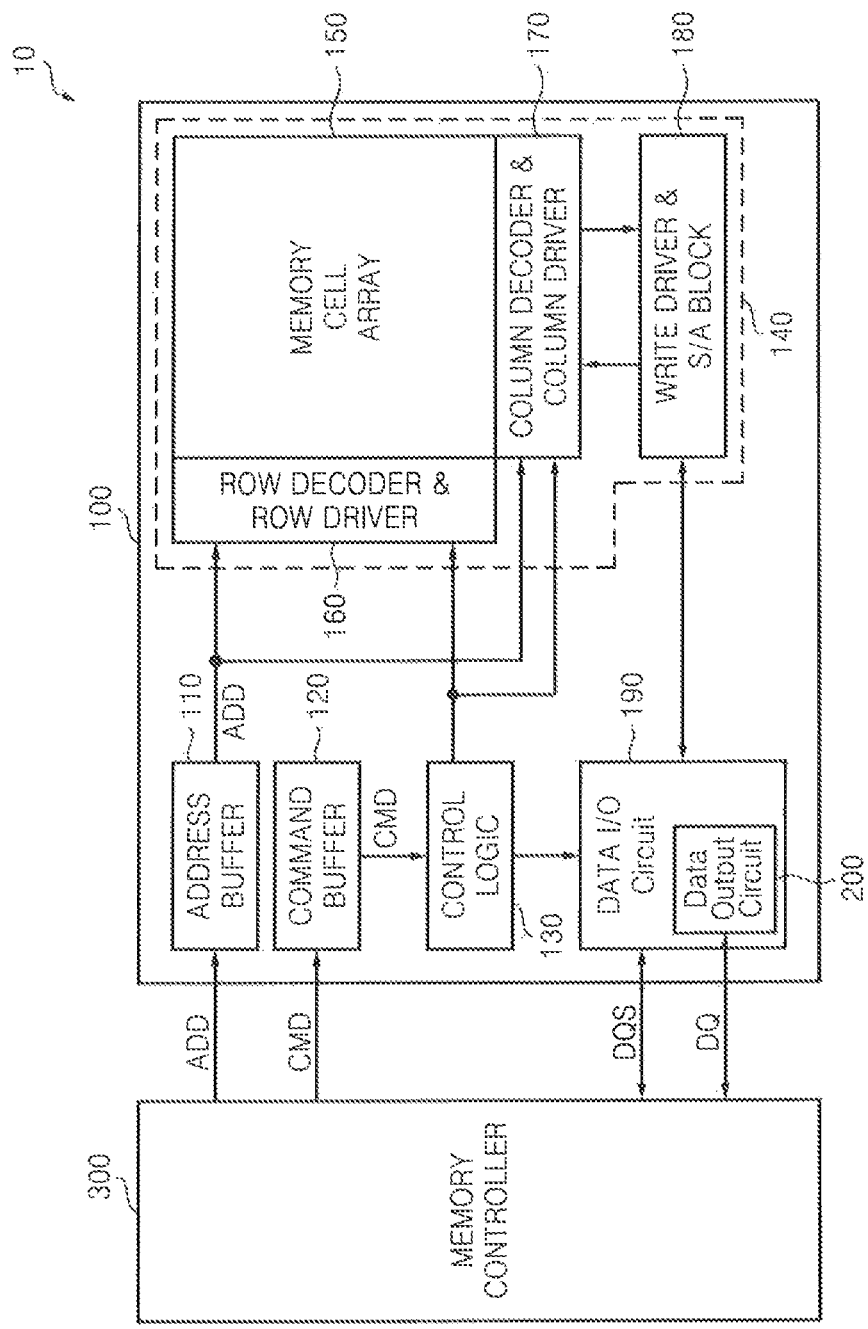
FIG. 2 is a detailed block diagram of the memory system illustrated in FIG. 1, according to an exemplary embodiment of the inventive concept.

FIG. 2 is a detailed block diagram of the memory system 10 illustrated in FIG. 1, according to an exemplary embodiment of the inventive concept. Referring to FIGS. 1 and 2, the memory system 10 may include a semiconductor memory device 100 and the memory controller 300. FIG. 2 shows one die (e.g., RAM0) in the memory module 50 illustrated in FIG. 1 and the memory controller 300.

The semiconductor memory device 100 may include an address buffer 110, a command buffer 120, a control logic 130, a data storing unit 140, and a data input/output (I/O) circuit 190. The address buffer 110 may receive the address information ADD from the memory controller 300, temporarily store the address information ADD, and transmit the address information ADD to the data storing unit 140 according to the control of the control logic 130. The command buffer 120 may receive the command signal CMD from the memory controller 300, temporarily store the command signal CMD, and transmit the command signal CMD to the control logic 130 according to the control of the control logic 130.

The control logic 130 may control the overall operation of the semiconductor memory device 100. Although not shown, the control logic 130 may include a command decoder, a clock generator, and a mode register set (MRS) circuit.

The data storing unit 140 may include a memory cell array 150, a row decoder and row driver 160, a column decoder and column driver 170, and a write driver and sense amplifier (S/A) block 180.

The memory cell array 150 includes word lines, bit lines, and memory cells each of which is connected to one of the word lines and one of the bit lines. The memory cells may store data of at least one bit. The memory cells may be non-volatile memory cells that retain data when power is cut off or volatile memory cells that retain data only while power is being supplied. Data may be stored in the memory cells using a fuse-cutting method, which uses a physical laser, or an electrical programming method. The memory cells may be dynamic random access memory (DRAM) cells, static RAM (SRAM) cells, synchronous DRAM (SDRAM) cells, electrically erasable programmable read-only memory (EEPROM) cells, flash memory cells, magnetic RAM (MRAM) cells, conductive bridging RAM (CBRAM) cells, ferroelectric RAM (FeRAM) cells, phase-change RAM (PRAM) cells, or resistive RAM (RRAM or ReRAM) cells.

The row decoder and row driver 160 may select one of the word lines based on the address information ADD output from the address buffer 110 and may drive the selected word lines to an operating voltage. The column decoder and column driver 170 may control the connection between each of the bit lines and the write driver and S/A block 180 based on the address information ADD output from the address buffer 110.

The write driver and S/A block 180 may generate a current signal corresponding to write data based on the write data received from the data I/O circuit 190 and may apply the current signal to at least one bit line connected by the column decoder and column driver 170. The write driver and S/A block 180 may sense and amplify a signal output from the at least one bit line connected by the column decoder and column driver 170, generate read data corresponding to the sensed and amplified signal, and transmit the read data to the data I/O circuit 190.

The data I/O circuit 190 may include a data input circuit (not shown) and a data output circuit 200, which operate according to the control of the control logic 130 and are connected to data I/O ports. The data output circuit 200 may transmit the data signal DQ to the memory controller 300. The structure and operations of the data output circuit 200 will be described in detail later.

The memory controller 300 may transmit various commands CMD to the semiconductor memory device 100 for controlling the operation of the semiconductor memory device 100. The memory controller 300 may transmit the address information ADD for the memory cell array 150, which will perform a read, write or test operation, to the semiconductor memory device 100. The memory controller 300 may transmit write data to be written to the memory cell array 150 to the semiconductor memory device 100 and may receive read data from the semiconductor memory device 100.

Figure 3:
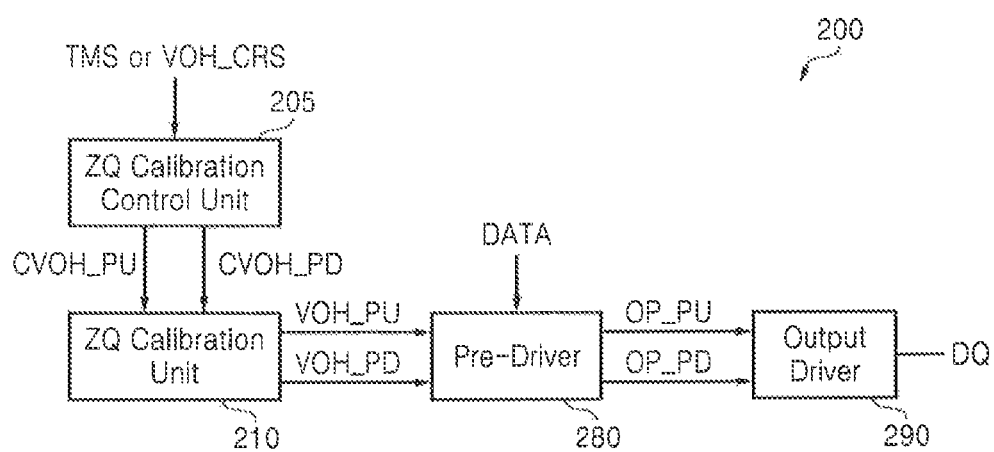
FIG. 3 is a detailed block diagram of a data output circuit illustrated in FIG. 2, according to an exemplary embodiment of the inventive concept.
Figure 4:
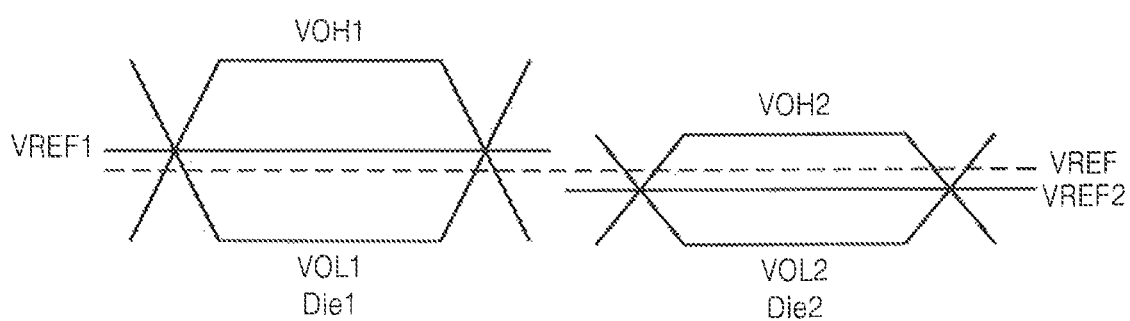
FIG. 4 is a diagram for explaining the operation of a ZQ calibration unit illustrated in FIG. 3, according to an exemplary embodiment of the inventive concept.

FIG. 3 is a detailed block diagram of the data output circuit 200 illustrated in FIG. 2, according to an exemplary embodiment of the inventive concept. FIG. 4 is a diagram for explaining the operation of a ZQ calibration unit 210 illustrated in FIG. 3, according to an exemplary embodiment of the inventive concept.

Referring to FIGS. 2 through 4, the data output circuit 200 may receive internal data DATA, e.g., read data, and output the data signal DQ according to the control of the control logic 130. The data signal DQ may have a high level or a low level according to the internal data DATA. The data signal DQ is an alternating current (AC) signal that swings between an output high level voltage (hereinafter, referred to as "VOH") and an output low level voltage (hereinafter, referred to as "VOL").

The memory controller 300 may receive the data signal DQ from each of the dies RAM0 through RAMp, determine VOH and VOL, and determine a reference voltage (VREF in FIG. 4) from the VOH and VOL. The memory controller 300 may compare the data signal DQ with the reference voltage VREF and determine a received data value (e.g., 0 or 1). Accordingly, an accurate determination of the reference voltage VREF can increase data reliability.

However, the data signal DQ output from the dies RAM0 through RAMp of the semiconductor memory device 100 may have a different VOH and VOL from die to die. Referring to FIG. 4, the data signal DQ from a first die Die1 may have a first VOH VOH1, a first VOL VOL1, and a first reference voltage VREF1 corresponding to the median value between the first VOH VOH1 and the first VOL VOL1. The data signal DQ from a second die Die2 may have a second VOH VOH2, a second VOL VOL2, and a second reference voltage VREF2 corresponding to the median value between the second VOH VOH2 and the second VOL VOL2.

The memory controller 300 calibrates the reference voltage VREF to a value between the first reference voltage VREF1 and the second reference voltage VREF2 according to a VOH difference between the first VOH VOH1 and the second VOH VOH2. The data signal DQ having the value between the first reference voltage VREF1 and the second reference voltage VREF2 may have noise. The VOH difference may occur due to quantization error, comparator offset, or power difference between dies. The VOH difference causes the signal integrity of the semiconductor memory device 100 to deteriorate. For example, when the data output circuit 200 is implemented using low voltage swing terminated logic (LVSTL), noise more sensitive to the VOH difference may be contained in the data signal DQ. Therefore, the VOH difference between the first VOH VOH1 and the second VOH VOH2 is reduced to reduce the difference between the first reference voltage VREF1 and the second reference voltage VREF2.

When the memory controller 300 determines that the difference between the first reference voltage VREF1 and the second reference voltage VREF2 exceeds a threshold, it may generate a VOH change request signal VOH_CRS and transmit it in a form of a command CMD to the semiconductor memory device 100. The control logic 130 may receive the VOH change request signal VOH_CRS or may transmit the VOH change request signal VOH_CRS or a test mode signal TMS to the data output circuit 200 when a test mode is entered. The test mode is for testing the state of the semiconductor memory device 100 and may be started by a special command CMD or an MRS command from the memory controller 300.

The data output circuit 200 may perform ZQ calibration according to the VOH change request signal VOH_CRS or the test mode signal TMS and output the data signal DQ whose VOH has been changed. The ZQ calibration is an operation of matching the impedance of the data output circuit 200 and that of a system on chip (SOC) on die termination (ODT) resistor ($R_{SOC.ODT}$ in FIG. 8) of the memory controller 300 to reduce signal reflection due to impedance mismatching. In the current embodiment, the ZQ calibration by the data output circuit 200 may also include an operation of reducing the VOH difference as well as the impedance matching. The data output circuit 200 may include a ZQ calibration control unit 205, the ZQ calibration unit 210, a pre-driver 280, and an output driver 290.

The ZQ calibration control unit 205 may generate a VOH control code according to the VOH change request signal VOH_CRS or the test mode signal TMS. The VOH change request signal VOH_CRS and the test mode signal TMS may include information about a result of comparing the reference voltage VREF with the VOH. The result of comparing the reference voltage VREF with the VOH is the result of comparing the reference voltage VREF with (VOH–VOL)/2 to reduce the VOH difference between dies (e.g., Die1 and Die2 in FIG. 4). The comparison between the reference voltage VREF and (VOH–VOL)/2 may be performed by the memory controller 300 or the semiconductor memory device 100.

The ZQ calibration control unit 205 may generate the VOH control code corresponding to information of the VOH change request signal VOH_CRS or the test mode signal TMS, which includes the information indicating whether to increase or decrease the VOH. The VOH control code may include a pull-up VOH control code CVOH_PU and a pull-down VOH control code CVOH_PD. The pull-up VOH control code CVOH_PU may be a code for changing a current generated by a pull-up driver (292 in FIG. 8) of the output driver 290 and the pull-down VOH control code CVOH_PD may be a code for changing the current generated by the pull-up driver 292 of the output driver 290 and a resistance of a pull-down driver (294 in FIG. 8) of the output driver 290.

Accordingly, to change only the current generated by the pull-up driver 292, the ZQ calibration control unit 205 may change the pull-up VOH control code CVOH_PU. To change both the current generated by the pull-up driver 292 and the resistance of the pull-down driver 294, the ZQ calibration control unit 205 may change the pull-down VOH control code CVOH_PD. In an exemplary embodiment of the inventive concept, the functions of the ZQ calibration control unit 205 may be performed by the control logic 130.

The ZQ calibration unit 210 may generate a VOH code according to the pull-up VOH control code CVOH_PU and the pull-down VOH control code CVOH_PD. The VOH code may include a pull-up VOH code VOH_PU and a pull-down VOH code VOH_PD. The pull-up VOH code VOH_PU may be a code for determining the current generated by the pull-up driver 292 and the pull-down VOH code VOH_PD may be a code for determining the current generated by the pull-up driver 292 and the resistance of the pull-down driver 294. The structure and operations of the ZQ calibration unit 210 will be described in detail with reference to FIGS. 5 through 7 later.

The pre-driver 280 may generate a pull-up driving signal OP_PU and a pull-down driving signal OP_PD based on the internal data DATA and the VOH code, e.g., the pull-up VOH code VOH_PU and the pull-down VOH code VOH_PD. For instance, when the internal data DATA is at a high level, the pre-driver 280 may buffer the pull-up VOH code VOH_PU and generate the pull-up driving signal OP_PU to be the same as the pull-up VOH code VOH_PU and generate the pull-down driving signal OP_PD for turning off all transistors included in the pull-down driver 294. Contrarily, when the internal data DATA is at a low level, the pre-driver 280 may buffer the pull-down VOH code VOH_PD and generate the pull-down driving signal OP_PD to be the same as the pull-down VOH code VOH_PD and generate the pull-up driving signal OP_PU for turning off all transistors included in the pull-up driver 292.

In other words, the pre-driver 280 may determine the current generated by the pull-up driver 292 and the resistance of the pull-down driver 294 when the output driver 290 outputs the data signal DQ.

The output driver 290 may include the pull-up driver 292 that generates the current determined by the pull-up driving signal OP_PU and the pull-down driver 294 that has the resistance determined by the pull-down driving signal OP_PD. The structure and operations of the output driver 290 will be described in detail with reference to FIG. 8 later.

Figure 5:
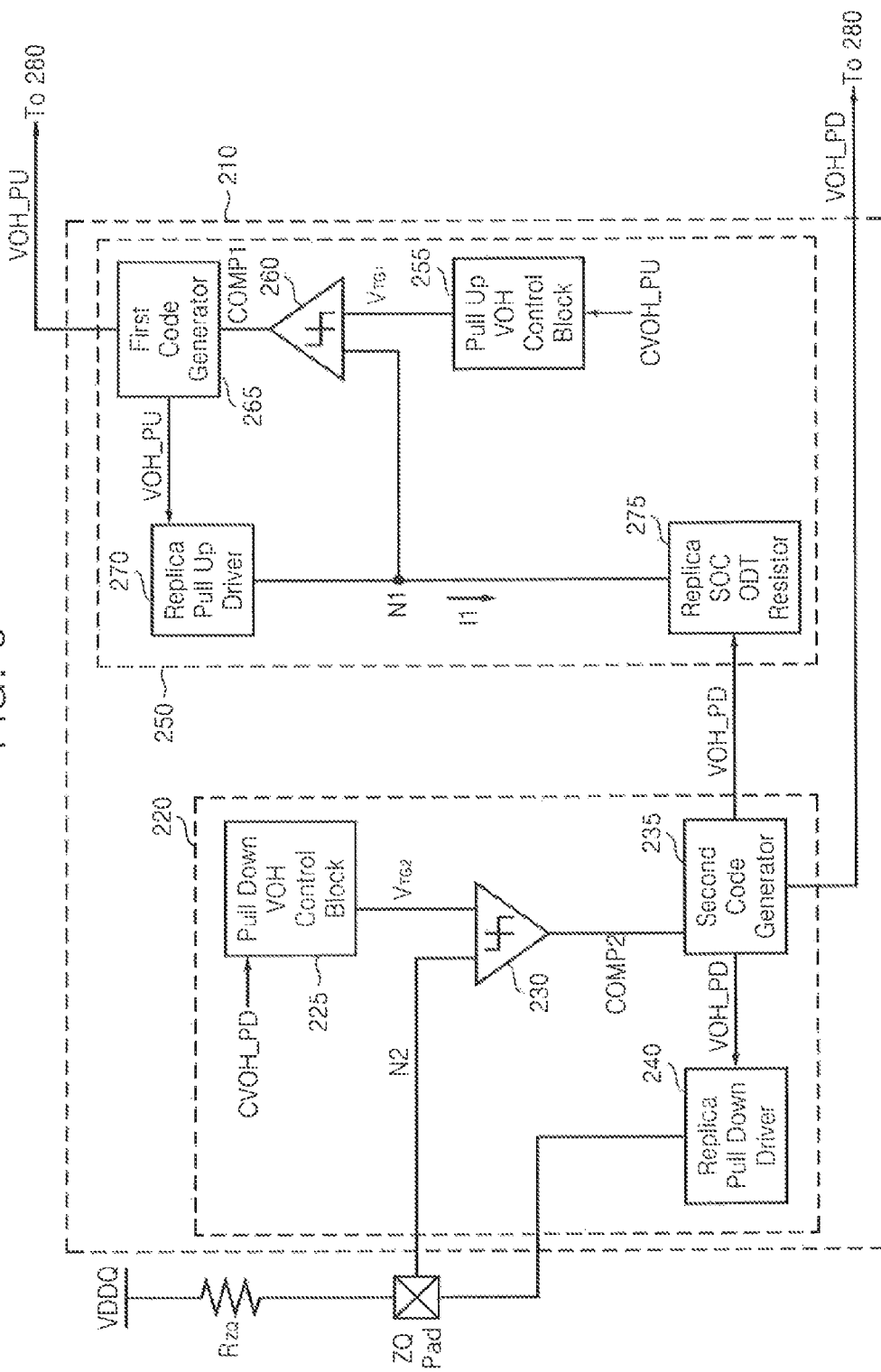
FIG. 5 is a detailed block diagram of the ZQ calibration unit illustrated in FIG. 3, according to an exemplary embodiment of the inventive concept.

FIG. 5 is a detailed block diagram of the ZQ calibration unit 210 illustrated in FIG. 3, according to an exemplary embodiment of the inventive concept. Referring to FIGS. 2 through 5, the ZQ calibration unit 210 may include a first ZQ calibration unit 250 and a second ZQ calibration unit 220.

The first ZQ calibration unit 250 may generate the pull-up VOH code VOH_PU, which determines the current generated by the pull-up driver 292 of the output driver 290, based on a first target VOH $V_{TG1}$ determined by the pull-up VOH control code CVOH_PU. The first ZQ calibration unit 250 may include a pull-up VOH control block 255, a first comparator 260, a first code generator 265, a replica pull-up driver 270, and a replica SOC ODT resistor 275.

The pull-up VOH control block 255 may generate the first target VOH $V_{TG1}$ according to the pull-up VOH control code CVOH_PU. The structure and operations of the pull-up VOH control block 255 will be described in detail with reference to FIGS. 6 and 7 later.

The first comparator 260 may generate and output a first comparison result COMP1 by comparing the first target VOH $V_{TG1}$ with a voltage of a first node N1. The first code generator 265 may generate the pull-up VOH code VOH_PU based on the first comparison result COMP1 and transmit the pull-up VOH code VOH_PU to the pre-driver 280 and the replica pull-up driver 270.

The replica pull-up driver 270 may generate a first current I1 flowing across the first node N1 according to the pull-up VOH code VOH_PU. The replica pull-up driver 270 may have the same structure as the pull-up driver 292 illustrated in FIG. 8. In other words, a fourth node N4 and a DQ pad of the pull-up driver 292 may correspond to the first node N1 of the replica pull-up driver 270. The replica pull-up driver 270 may be connected to the replica SOC ODT resistor 275 via the first node N1. The first current I1 may determine the voltage of the first node N1 together with a resistance of the replica SOC ODT resistor 275.

The replica SOC ODT resistor 275 may determine the voltage of the first node N1 based on the first current I1. The replica SOC ODT resistor 275 may be implemented in the same manner as the SOC ODT resistor $R_{SOC.ODT}$ illustrated in FIG. 8. The resistance of the replica SOC ODT resistor 275 may be determined by the pull-down VOH code VOH_PD generated by a second code generator 235.

Assuming that the pull-up VOH control block 255 receives the pull-up VOH control code CVOH_PU for increasing the VOH, the operations of the first ZQ calibration unit 250 will be described below.

The pull-up VOH control block 255 generates the first target VOH $V_{TG1}$ corresponding to the pull-up VOH control code CVOH_PU for increasing the current VOH (e.g., VDDQ/3 or VDDQ/2.5). The first target VOH $V_{TG1}$ may be higher than the current VOH. Since the voltage of the first node N1 is the same as the current VOH, the first comparator 260 may generate the first comparison result COMP1 corresponding to the determination that the voltage of the first node N1 is lower than the first target VOH $V_{TG1}$.

The first code generator 265 may generate the pull-up VOH code VOH_PU for increasing the first current I1 of the replica pull-up driver 270 based on the first comparison result COMP1. For instance, it is assumed that like the pull-up driver 292 illustrated in FIG. 8 the replica pull-up driver 270 includes "n" pull-up transistors NU0 through NUn and the size, e.g., the channel width/channel length of the pull-up transistors NU0 through NUn increases sequentially from the 0-th pull-up transistor NU0 toward the n-th pull-up transistor NUn. At this time, when bits (although not shown, VOH_PU0 through VOH_PUn respectively corresponding to OP_PU0 through OP_PUn) of the pull-up VOH code VOH_PU, which are respectively input to the pull-up transistors NU0 through NUn, are "0001 0000", the first code generator 265 may generate the pull-up VOH code VOH_PU having bits "1001 0000" to increase the first current I1.

As the first current I1 increases, the voltage of the first node N1 can be increased according to Ohm's law in relation with the replica SOC ODT resistor 275. Thereafter, the generation of a new pull-up VOH code VOH_PU may be repeated until the voltage of the first node N1 becomes the same as (or about the same as) the first target VOH $V_{TG1}$.

Since the replica pull-up driver 270 and the replica SOC ODT resistor 275 respectively correspond to the pull-up driver 292 and the SOC ODT resistor $R_{SOC.ODT}$, the first node N1 corresponds to the DQ pad. Accordingly, the VOH of the data signal DQ is increased by the operation of the first ZQ calibration unit 250.

The second ZQ calibration unit 220 may generate the pull-down VOH code VOH_PD, which determines the resistance of the pull-down driver 294 of the output driver 290, based on a second target VOH $V_{TG2}$ determined by the pull-down VOH control code CVOH_PD. The second ZQ calibration unit 220 may include a pull-down VOH control block 225, a second comparator 230, a second code generator 235, and a replica pull-down driver 240.

The pull-down VOH control block 225 may generate the second target VOH $V_{TG2}$ according to the pull-down VOH control code CVOH_PD. The structure and operations of the pull-down VOH control block 225 will be described in detail with reference to FIGS. 6 and 7 later.

The second comparator 230 may generate and output a second comparison result COMP2 by comparing the second target VOH $V_{TG2}$ with a voltage of a second node N2, e.g., a voltage of a ZQ pad. The second code generator 235 may generate the pull-down VOH code VOH_PD based on the second comparison result COMP2 and transmit the pull-down VOH code VOH_PD to the pre-driver 280, the replica pull-down driver 240, and the replica SOC ODT resistor 275.

The replica pull-down driver 240 may have a resistance varying with the pull-down VOH code VOH_PD and may determine the voltage of the second node N2. The replica pull-down driver 240 may have the same structure as the pull-down driver 294 illustrated in FIG. 8. In other words, the fourth node N4 of the pull-down driver 294 may correspond to the second node N2 of the second ZQ calibration unit 220. The replica pull-down driver 240 may be connected to a ZQ resistor $R_{ZQ}$ via the ZQ pad. The resistance of the replica pull-down driver 240 may determine the voltage of the second node N2 because it is used to divide the power supply voltage VDDQ together with the ZQ resistor $R_{ZQ}$.

The ZQ resistor $R_{ZQ}$ may be provided outside the semiconductor memory device 100, e.g., in an area other than the dies RAM0 through RAMp, in the memory module 50 for ZQ calibration. The ZQ resistor $R_{ZQ}$ may have a resistance of 240Ω, but the inventive concept is not restricted to the this example.

Assuming that the pull-down VOH control block 225 receives the pull-down VOH control code CVOH_PD for decreasing the VOH, the operations of the second ZQ calibration unit 220 will be described below.

The pull-down VOH control block 225 generates the second target VOH $V_{TG2}$ corresponding to the pull-down VOH control code CVOH_PD for decreasing the current VOH (e.g., VDDQ/3 or VDDQ/2.5). The second target VOH $V_{TG2}$ may be lower than the current VOH. When the voltage of the second node N2 is the same as the current VOH, the second comparator 230 may generate the second comparison result COMP2 corresponding to the determination that the voltage of the second node N2 is higher than the second target VOH $V_{TG2}$.

The second code generator 235 may generate the pull-down VOH code VOH_PD for decreasing the resistance of the replica pull-down driver 240 based on the second comparison result COMP2. For instance, it is assumed that like the pull-down driver 294 illustrated in FIG. 8 the replica pull-down driver 240 includes "n" pull-down transistors ND0 through NDn and the size, e.g., the channel width/channel length of the pull-down transistors ND0 through NDn increases sequentially from the 0-th pull-down transistor ND0 toward the n-th pull-down transistor NDn. At this time, when bits (although not shown, VOH_PD0 through VOH_PDn respectively corresponding to OP_PD0 through OP_PDn) of the pull-down VOH code VOH_PD, which are respectively input to the pull-down transistors ND0 through NDn, are "0001 0000", the second code generator 235 may generate the pull-down VOH code VOH_PD having bits "1001 0000" to decrease the resistance of the replica pull-down driver 240. As a result, the voltage of the second node N2 is decreased.

The generation of a new pull-down VOH code VOH_PD may be repeated until the voltage of the second node N2 becomes the same as (or about the same as) the second target VOH $V_{TG2}$.

When the pull-down VOH1 code VOH_PD for decreasing the resistance of the replica pull-down driver 240 is generated, the resistance of the replica SOC ODT resistor 275 which is determined by the pull-down VOH code VOH_PD is also decreased. Accordingly, the voltage of the first node N1 is decreased and, when the first target VOH $V_{TG1}$ is the same as the current VOH (e.g., VDDQ/3 or VDDQ/2.5), the first comparator 260 may generate the first comparison result COMP1 corresponding to the determination that the voltage of the first node N1 is lower than the first target VOH $V_{TG1}$.

The first code generator 265 may generate the pull-up VOH code VOH_PU enabling the replica pull-up driver 270 to increase the first current I1 based on the first comparison result COMP1. As the first current I1 increases, the voltage of the first node N1 can be increased according to Ohm's law in relation with the replica SOC ODT resistor 275. Thereafter, the generation of the new pull-up VOH code VOH_PU may be repeated until the voltage of the first node N1 becomes the same as (or about the same as) the first target VOH $V_{TG1}$.

Since the replica pull-up driver 270 and the replica SOC ODT resistor 275 respectively correspond to the pull-up driver 292 and the SOC ODT resistor $R_{SOC.ODT}$, the first node N1 corresponds to the DQ pad. Accordingly, the VOH of the data signal DQ is increased and the resistance of the pull-down driver 294 is adjusted by the operation of the second ZQ calibration unit 220.

In other words, when the semiconductor memory device 100 according to an exemplary embodiment of the inventive concept is used, the VOH is adjusted to be constant in each die, so that signal integrity can be increased. For example, when the output driver 290 is implemented as an LVSTL output driver in which the difference between VOL and VOH is very small, the adjustment of the VOH may have a big impact.

Figure 6:
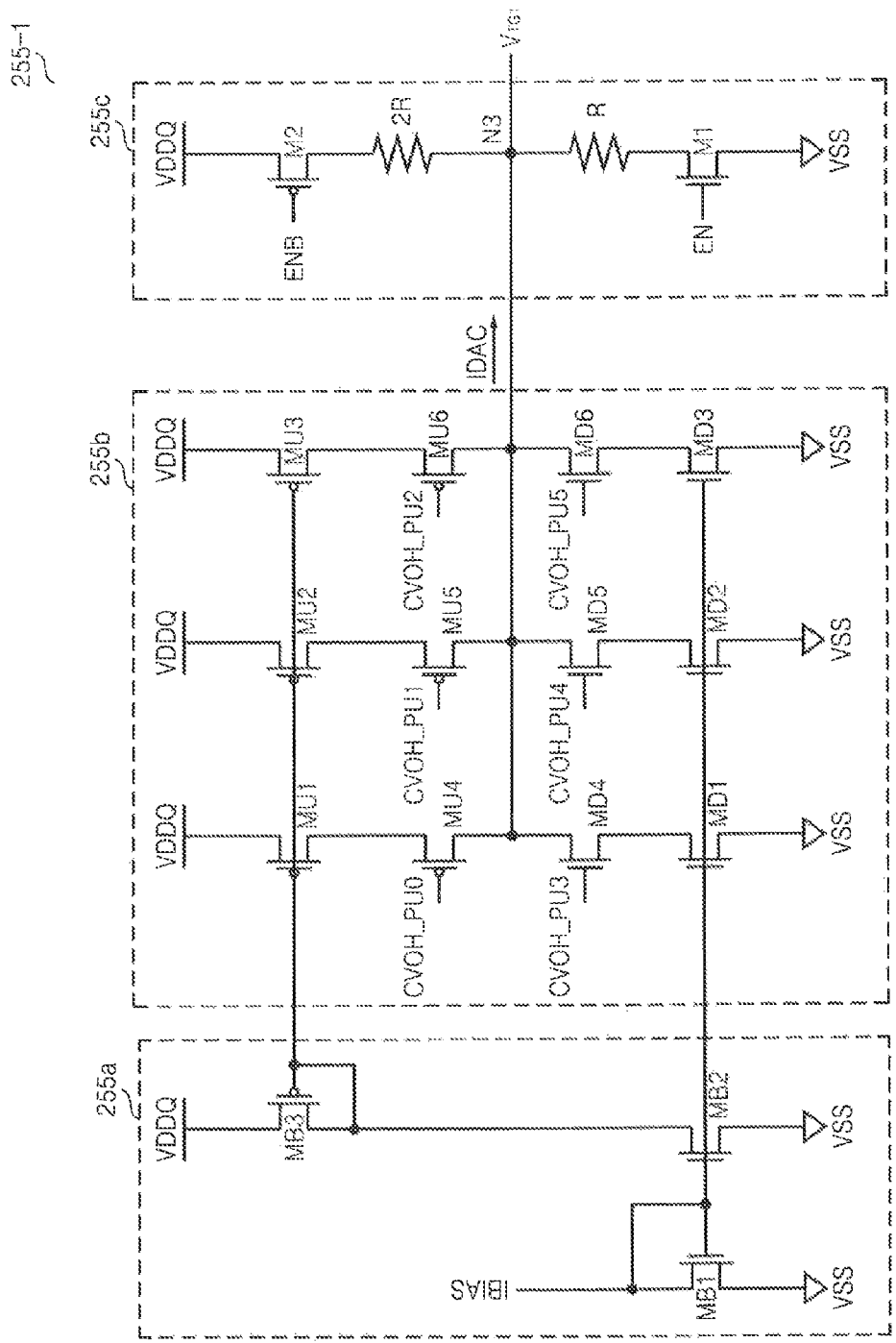
FIG. 6 is a circuit diagram of an exemplary embodiment of a pull-up output high level voltage (VOH) control block or a pull-down VOH control block illustrated in FIG. 5.

FIG. 6 is a circuit diagram of an exemplary embodiment 255-1 of the pull-up VOH control block 255 or the pull-down VOH control block 225 illustrated in FIG. 5. Referring to FIGS. 5 and 6, FIG. 6 shows the exemplary embodiment 255-1 of the pull-up VOH control block 255 and the structure and operations of the pull-down VOH control block 225 are similar to those of the pull-up VOH control block 255, and therefore, only the pull-up VOH control block 255-1 will be described. It is assumed that the pull-up VOH control code CVOH_PU is comprised of six bits CVOH_PU0 through CVOH_PU5 in the embodiment illustrated in FIG. 6. The pull-up VOH control block 255-1 may include a bias unit 255a, a current generation unit 255b, and a voltage generation unit 255c.

The bias unit 255a includes a first bias transistor MB1 which receives a bias current IBIAS (e.g., 10 µA) and mirrors a gate voltage; a second bias transistor MB2 which receives a gate voltage of the first bias transistor MB1 and generates a current, thereby decreasing a gate voltage of a third bias transistor MB3; and the third bias transistor MB3 which transmits a bias voltage corresponding to the gate voltage of the first bias transistor MB1 to the current generation unit 255b. The first and second bias transistors MB1 and MB2 may be N-channel metal oxide semiconductor (NMOS) transistors and the third bias transistor MB3 may be a P-channel MOS (PMOS) transistor. The bias current IBIAS may be a current generated by scaling the power supply voltage VDDQ of the semiconductor memory device 100.

The current generation unit 255b may include first through third down transistors MD1 through MD3 which receive a voltage corresponding to the gate voltage of the first bias transistor MB1 and first through third up transistors MU1 through MU3 which receive a bias voltage corresponding to the gate voltage of the third bias transistor MB3. The current generation unit 255b may also include fourth through sixth up transistors MU4 through MU6 and fourth through sixth down transistors MD4 through MD6, which are connected to a third node N3 and respectively receive the six bits CVOH_PU0 through CVOH_PU5 of the pull-up VOH control code CVOH_PU, between the first through third down transistors MD1 through MD3 and the first through third up transistors MU1 through MU3.

The first through sixth up transistors MU1 through MU6 may be PMOS transistors and the first through sixth down transistors MD1 through MD6 may be NMOS transistors. It is assumed that the size of the first through third up transistors MU1 through MU3 increases sequentially from the first up transistor MU1 toward the third up transistor MU3 and the size of the first through third down transistors MD1 through MD3 increases sequentially from the first down transistor MD1 toward the third down transistor MD3.

The fourth through sixth up transistors MU4 through MU6 are turned off when respectively receiving the pull-up VOH control code bits CVOH_PU0 through CVOH_PU2 at a high level. At this time, the fourth through sixth down transistors MD4 through MD6 may be turned on or off according to the respective pull-up VOH control code bits CVOH_PU3 through CVOH_PU5. A control current IDAC, e.g., the sum of current corresponding to the size of at least one of the first through third down transistors MD1 through MD3, which is connected with a transistor turned on among the fourth through sixth down transistors MD4 through MD6, is carried to the third node N3.

It is assumed that the first down transistor MD1 is ¼ of the size of the first bias transistor MB1, the second down transistor MD2 is ½ of the size of the first bias transistor MB1, and the third down transistor MD3 is the same size as the first bias transistor MB1. When the pull-up VOH control code bits CVOH_PU0 through CVOH_PU5 are "111 010", the control current IDAC is 15 µA, which is the sum of a current generated by the second down transistor MD2 and a current generated by the third down transistor MD3. To increase the first target VOH $V_{TG1}$, the ZQ calibration control unit 205 may generate the pull-up VOH control code CVOH_PU having the bits "111 111" to increase the control current IDAC.

The voltage generation unit 255c may include a second enable transistor M2 and a resistor 2R connected in series between the power supply voltage VDDQ and the third node N3 and a resistor R and a first enable transistor M1 connected in series between the third node N3 and a ground voltage VSS. The first enable transistor M1 may be an NMOS transistor and the second enable transistor M2 may be a PMOS transistor.

An enable signal EN may be at a high level according to the control of the control logic 130 when the VOH or the resistance of the output driver 290 is adjusted. An inverted enable signal ENB is a result of inverting the enable signal EN. The resistor 2R has a resistance double the resistance of the resistor R.

When the enable signal EN is at the high level, the first enable transistor M1 and the second enable transistor M2 may be turned on. At this time, the first target VOH $V_{TG1}$ is defined as Equation 1 at the third node N3 according to Kirchhoff's law:

$$V_{TG1} = \frac{R}{R+2R} \times VDDQ + \left(\frac{R \times 2R}{R+2R}\right) \times IDAC. \quad (1)$$

Here, the resistance of the first and second enable transistors M1 and M2 is ignored. Consequently, the first target VOH $V_{TG1}$ when resolution, e.g., a least significant bit (CVOH_PU3 in FIG. 6), increases or decreases can be adjusted by adjusting the resistance of the resistors R and 2R and the number and size of the transistors MD1 through MD3 and MU1 through MU3.

Figure 7:
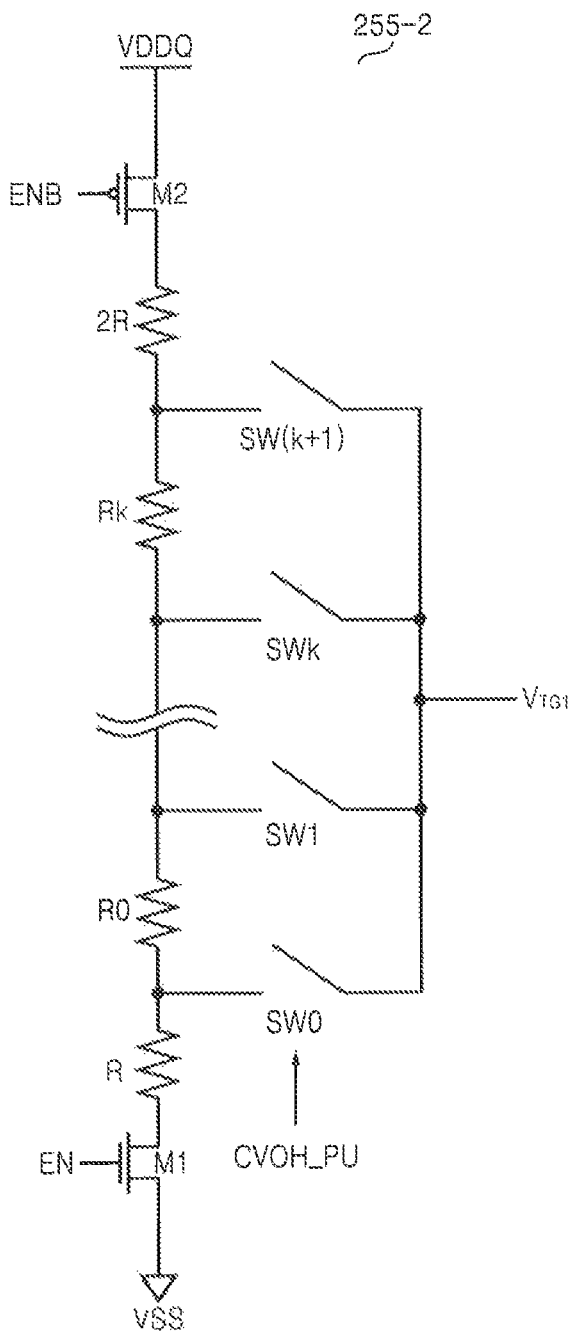
FIG. 7 is a circuit diagram of an exemplary embodiment of the pull-up VOH control block or the pull-down VOH control block illustrated in FIG. 5.

FIG. 7 is a circuit diagram of an exemplary embodiment 255-2 of the pull-up VOH control block 255 or the pull-down VOH control block 225 illustrated in FIG. 5. Referring to FIGS. 5 and 7, FIG. 7 shows the exemplary embodiment 255-2 of the pull-up VOH control block 255 and the structure and operations of the pull-down VOH control block 225 are similar to those of the pull-up VOH control block 255, and therefore, only the pull-up VOH control block 255-2 will be described.

Like the voltage generation unit 255c illustrated in FIG. 6, the pull-up VOH control block 255-2 may include the first enable transistor M1, the second enable transistor M2, and the resistors R and 2R. However, the pull-up VOH control block 255-2 may also include a plurality of resistors R0 through Rk connected in series between the resistors R and 2R and a plurality of switches SW0 through SW(k+1) each of which connected between a node between two adjacent resistors among the resistors R0 through Rk and a node through which the first target VOH $V_{TG1}$ is output.

The switches SW0 through SW(k+1) may respectively receive the bits of the pull-up VOH control code CVOH_PU. For instance, the pull-up VOH control code CVOH_PU may be comprised of (k+1) bits and the switches SW0 through SW(k+1) may sequentially and respectively receive the (k+1) bits.

The resistors R0 through Rk may have the same resistance, but the inventive concept is not restricted to the current embodiment. It is assumed that the resistors R0 through Rk have the same resistance as the resistor R in the current embodiment.

When the enable signal EN is at the high level, the pull-up VOH control block 255-2 may output the first target VOH $V_{TG1}$ determined by voltage division performed according to the connection state of the switches determined by the pull-up VOH control code CVOH_PU. For instance, when k=3 and the pull-up VOH control code CVOH_PU is "0101", the first through fourth switches SW0 through SW3 receive the bits, 0, 1, 0, and 1, respectively, and only the second and fourth switches SW1 and SW3 is shorted. Accordingly, only the resistor R0 enables current to flow across, and therefore, the first target VOH $V_{TG1}$ becomes VDDQ/2 according to voltage division (the resistance of the transistors M1 and M2 is ignored at this time).

Figure 8:
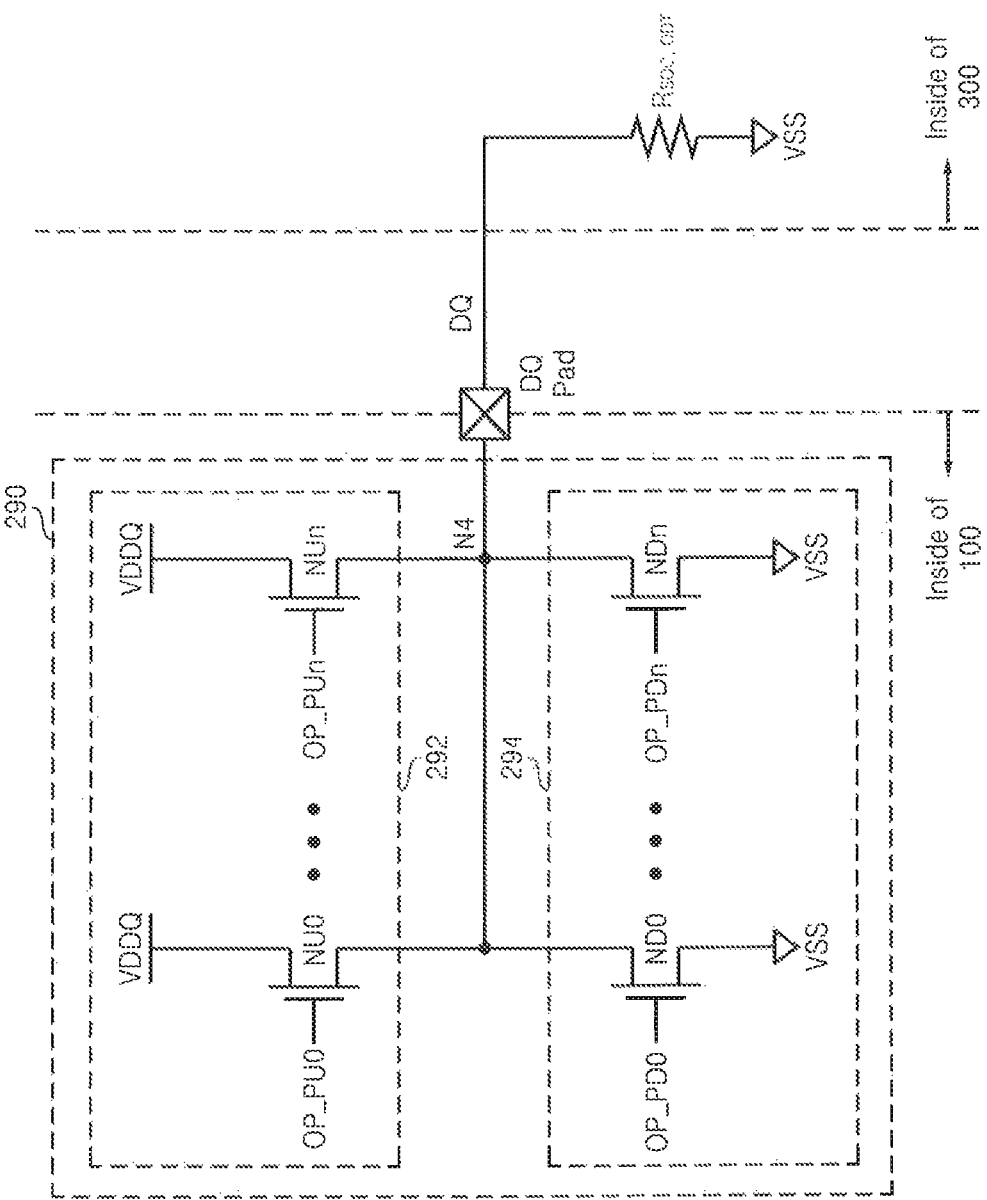
FIG. 8 is a detailed circuit diagram of an output driver illustrated in FIG. 3, according to an exemplary embodiment of the inventive concept.

FIG. 8 is a detailed circuit diagram of the output driver 290 illustrated in FIG. 3, according to an exemplary embodiment of the inventive concept. Referring to FIGS. 3, 5, and 8, the output driver 290 may include the pull-up driver 292 and the pull-down driver 294.

The pull-up driver 292 may include the 0th through n-th pull-up transistors NU0 through NUn connected between the power supply voltage VDDQ and the fourth node N4. Each of the 0th through n-th pull-up transistors NU0 through NUn may be an NMOS transistor.

The pull-down driver 294 may include the 0th through n-th pull-down transistors ND0 through NDn connected between the ground voltage VSS and the fourth node N4. Each of the 0th through n-th pull-down transistors ND0 through NDn may be an NMOS transistor.

When the internal data DATA is at the high level, the pull-up driver 292 may receive the pull-up driving signal OP_PU corresponding to the pull-up VOH code VOH_PU from the pre-driver 280 and generate the current determined by the pull-up VOH code VOH_PU. The transistors ND0 through NDn included in the pull-down driver 294 may all be turned off according to the pull-down driving signal OP_PD for turning off the transistors ND0 through NDn.

At this time, the current generated by the pull-up driver 292 may be transmitted to the SOC ODT resistor $R_{SOC.ODT}$ in the memory controller 300 via the DQ pad. The data signal DQ that the SOC ODT resistor $R_{SOC.ODT}$ receives is determined by the current generated by the pull-up driver 292 and the SOC ODT resistor $R_{SOC.ODT}$ and has the VOH that has been adjusted according to the pull-up VOH code VOH_PU generated by the ZQ calibration unit 210.

When the internal data DATA is at the low level, the pull-up driver 292 may receive the pull-up driving signal OP_PU for turning off all the transistors NU0 through NUn from the pre-driver 280 and the transistors NU0 through NUn included in the pull-up driver 292 may all be turned off according to the pull-up driving signal OP_PU. The pull-down driver 294 may receive the pull-down driving signal OP_PD corresponding to the pull-down VOH code VOH_PD and may have a resistance determined by the pull-down VOH code VOH_PD. At this time, no current is generated by the pull-up driver 292, and therefore, the data signal DQ that the SOC ODT resistor $R_{SOC.ODT}$ receives has the VOL the same as the ground voltage VSS.

According to an exemplary embodiment of the inventive concept, the total resistance, e.g., termination resistance (RTT), of the pull-up driver 292 or the pull-down driver 294 may be changed in response to a particular pull-up or pull-down driving signal OP_PU or OP_PD. At this time, single loading or double loading can be implemented by changing the number of DIMMs (e.g., the memory modules 50 in FIG. 1) inserted into a memory slot and an RTT appropriate to conditions can be selected. For instance, the RTT may be changed from $R_{ZQ}/1$ to $R_{ZQ}/2$ and $R_{ZQ}/4$ (where $R_{ZQ}=240\Omega$) according to an MRS setting.

Figure 9:
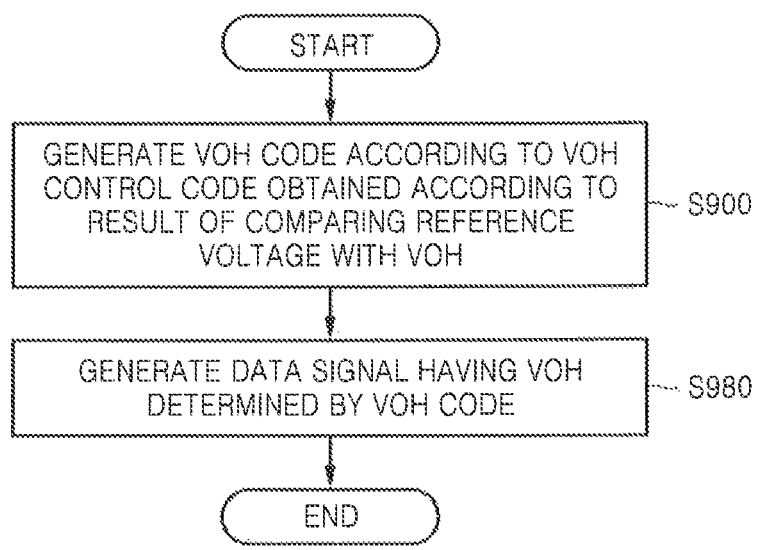
FIG. 9 is a flowchart of a method of operating a semiconductor memory device illustrated in FIG. 1 according to an exemplary embodiment of the inventive concept.
Figure 10:
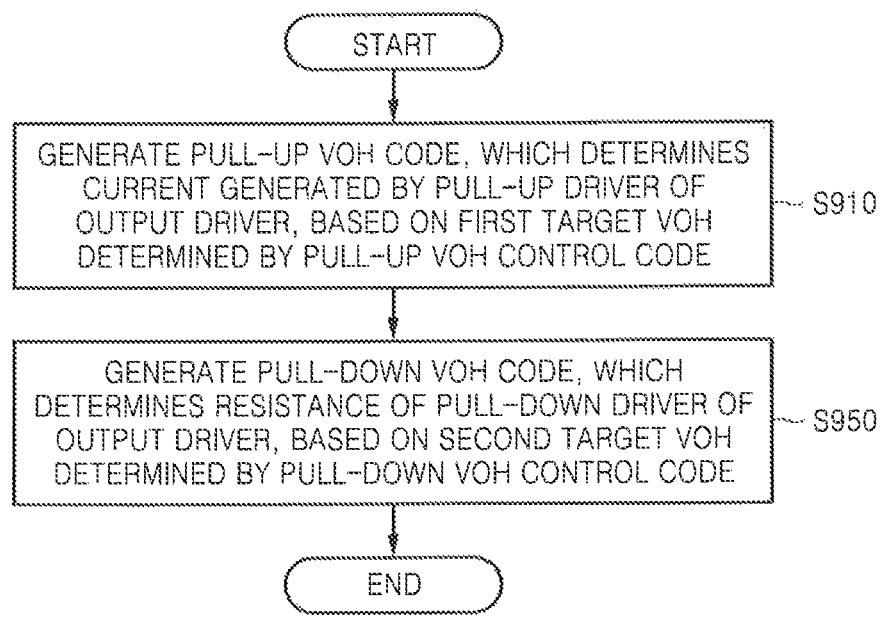
FIG. 10 is a detailed flowchart of an operation of generating a VOH code in the method illustrated in FIG. 9, according to an exemplary embodiment of the inventive concept.
Figure 11:
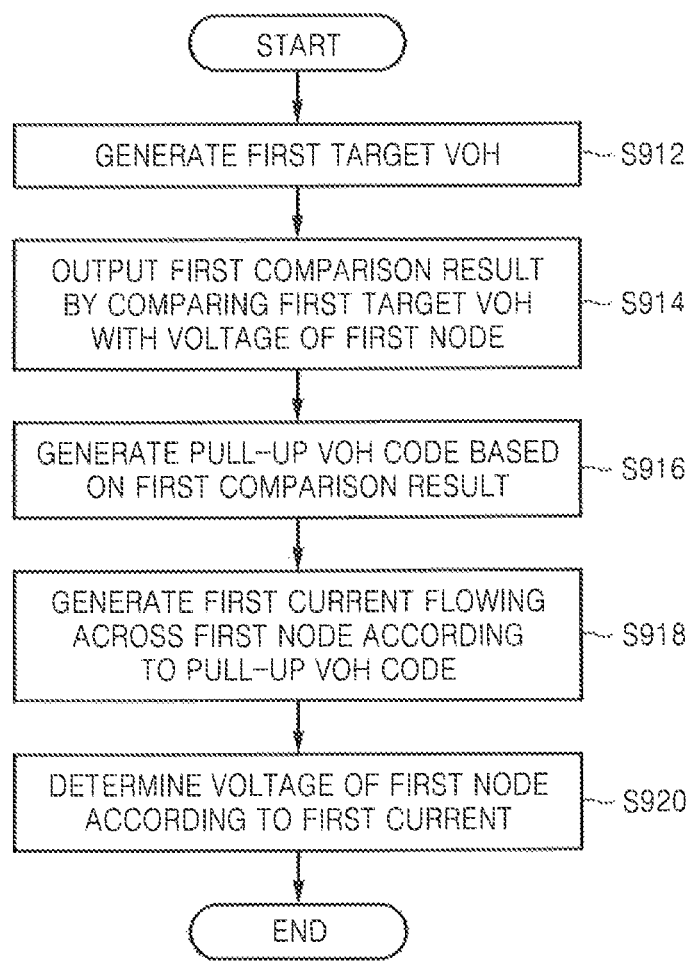
FIG. 11 is a detailed flowchart of an operation of generating a pull-up VOH code illustrated in FIG. 10, according to an exemplary embodiment of the inventive concept.
Figure 12:
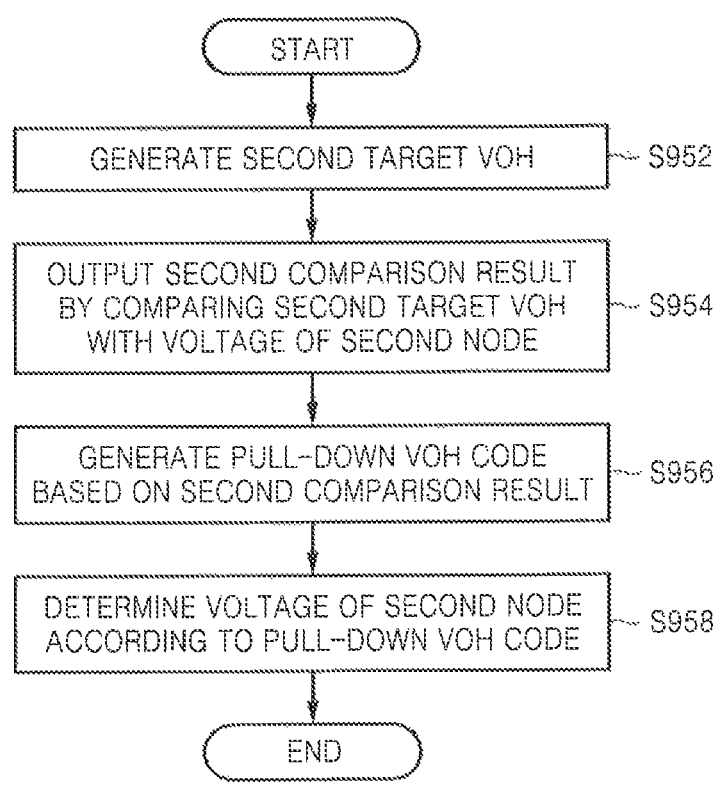
FIG. 12 is a detailed flowchart of an operation of generating a pull-down VOH code illustrated in FIG. 10, according to an exemplary embodiment of the inventive concept.

FIG. 9 is a flowchart of a method of operating the semiconductor memory device 100 illustrated in FIG. 1 according to an exemplary embodiment of the inventive concept. FIG. 10 is a detailed flowchart of an operation of generating a VOH code in the method illustrated in FIG. 9, according to an exemplary embodiment of the inventive concept. FIG. 11 is a detailed flowchart of an operation of generating the pull-up VOH code VOH_PU illustrated in FIG. 10, according to an exemplary embodiment of the inventive concept. FIG. 12 is a detailed flowchart of an operation of generating the pull-down VOH code VOH_PD illustrated in FIG. 10, according to an exemplary embodiment of the inventive concept.

Referring to FIGS. 1, 3, 5, and 9 through 12, the ZQ calibration unit 210 may generate the VOH code according to the pull-up VOH control code CVOH_PU and the pull-down VOH control code CVOH_PD, which are obtained according to the result of comparing the reference voltage VREF with the VOH, in operation S900. The VOH code may include the pull-up VOH code VOH_PU and the pull-down VOH code VOH_PD.

The pre-driver 280 may generate the pull-up driving signal OP_PU and the pull-down driving signal OP_PD based on the pull-up VOH code VOH_PU, the pull-down VOH code VOH_PD, and the internal data DATA. The output driver 290 may generate the data signal DQ having the VOH determined by the pull-up driving signal OP_PU and the pull-down driving signal OP_PD in operation S980.

Operation S900 may include operations S910 and S950 in FIG. 10. The ZQ calibration unit 210 may include the first ZQ calibration unit 250 and the second ZQ calibration unit 220.

The first ZQ calibration unit 250 may generate the pull-up VOH code VOH_PU, which determines the current generated by the pull-up driver 292 of the output driver 290, based on the first target VOH $V_{TG1}$ determined by the pull-up VOH control code CVOH_PU in operation S910. The second ZQ calibration unit 220 may generate the pull-down VOH code VOH_PD, which determines the resistance of the pull-down driver 294 of the output driver 290, based on the second target VOH $V_{TG2}$ determined by the pull-down VOH control code CVOH_PD in operation S950.

Operation S910 may include operations S912 through S920 in FIG. 11. The first ZQ calibration unit 250 may include the pull-up VOH control block 255, the first comparator 260, the first code generator 265, the replica pull-up driver 270, and the replica SOC ODT resistor 275.

The pull-up VOH control block 255 may generate the first target VOH $V_{TG1}$ according to the pull-up VOH control code CVOH_PU in operation S912. The first comparator 260 may generate and output the first comparison result COMP1 by comparing the first target VOH $V_{TG1}$ with the voltage of the first node N1 in operation S914.

The first code generator 265 may generate the pull-up VOH code VOH_PU based on the first comparison result COMP1 and transmit it to the pre-driver 280 and the replica pull-up driver 270 in operation S916. The replica pull-up driver 270 may generate the first current I1 flowing across the first node N1 according to the pull-up VOH code VOH_PU in operation S918. The replica SOC ODT resistor 275 may determine the voltage of the first node N1 according to the first current I1 in operation S920. Until the voltage of the first node N1 becomes the same as the first target VOH $V_{TG1}$, the generation of the pull-up VOH code VOH_PU may be repeated.

Operation S950 may include operations S952 through S958 in FIG. 12. The second ZQ calibration unit 220 may include the pull-down VOH control block 225, the second comparator 230, the second code generator 235, and the replica pull-down driver 240.

The pull-down VOH control block 225 may generate the second target VOH $V_{TG2}$ according to the pull-down VOH control code CVOH_PU in operation S952. The second comparator 230 may generate and output the second comparison result COMP2 by comparing the second target VOH $V_{TG2}$ with the voltage of the second node N2, e.g., the voltage of the ZQ pad in operation S954.

The second code generator 235 may generate the pull-down VOH code VOH_PD based on the second comparison result COMP2 and transmit it to the pre-driver 280, the replica pull-down driver 240, and the replica SOC ODT resistor 275 in operation S956. The replica pull-down driver 240 may have a resistance changed according to the pull-down VOH code VOH_PD and determine the voltage of the second node N2 in operation S958. Until the voltage of the second node N2 becomes the same as (or about the same as) the second target VOH $V_{TG2}$, the generation of the pull-down VOH code VOH_PD may be repeated.

Figure 13:
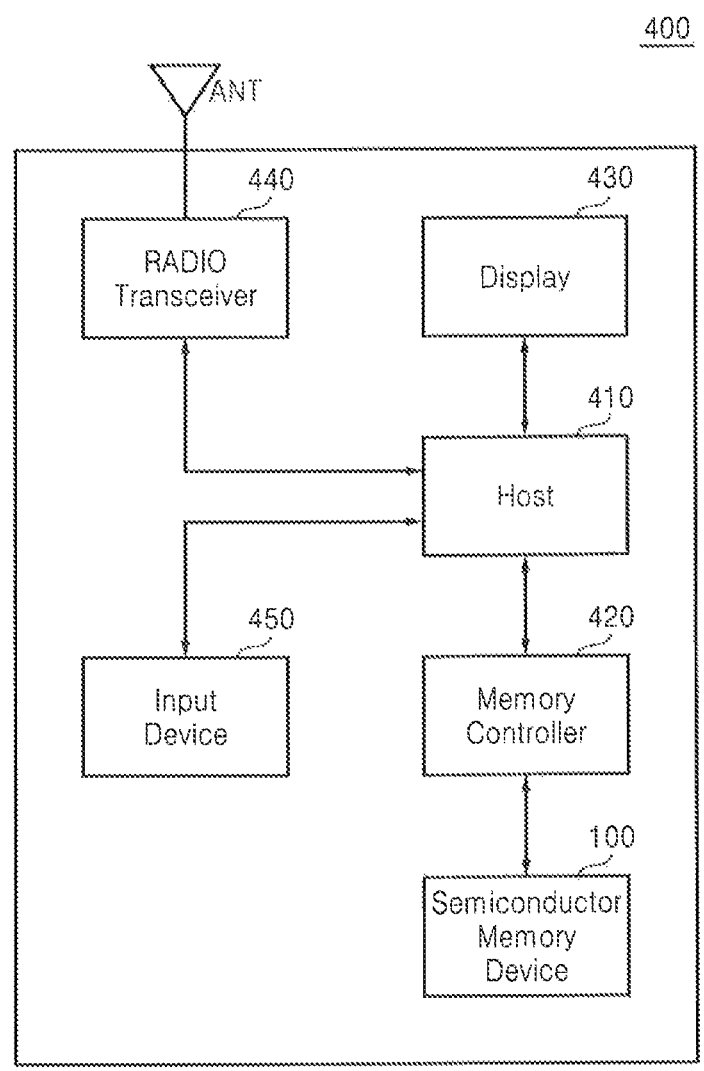
FIG. 13 is a block diagram of a computer system including the semiconductor memory device illustrated in FIG. 1 according to an exemplary embodiment of the inventive concept.

FIG. 13 is a block diagram of a computer system 400 including the semiconductor memory device 100 illustrated in FIG. 1 according to an exemplary embodiment of the inventive concept. Referring to FIGS. 1 through 13, the computer system 400 may be a cellular phone, a smart phone, a tablet personal computer (PC), a personal digital assistant (PDA) or a radio communication system.

The computer system 400 includes the semiconductor memory device 100 and a memory controller 420 for controlling the operations of the semiconductor memory device 100. The memory controller 420 may control the data access operations, e.g., a write operation or a read operation, of the semiconductor memory device 100 according to the control of a host 410. The memory controller 420 may be the memory controller 300 illustrated in FIG. 1.

The data in the semiconductor memory device 100 may be displayed through a display 430 according to the control of the host 410 and/or the memory controller 420.

A radio transceiver 440 transmits or receives radio signals through an antenna ANT. The radio transceiver 440 may convert radio signals received through the antenna ANT into signals that can be processed by the host 410. Accordingly, the host 410 may process the signals output from the radio transceiver 440 and transmit the processed signals to the memory controller 420 or the display 430. The memory controller 420 may program the signals processed by the host 410 to the semiconductor memory device 100.

The radio transceiver 440 may also convert signals output from the host 410 into radio signals and output the radio signals to an external device through the antenna ANT.

An input device 450 enables control signals for controlling the operation of the host 410 or data to be processed by the host 410 to be input to the computer system 400. The input device 450 may be a pointing device such as a touch pad or a computer mouse, a keypad, or a keyboard.

The host 410 may control the operation of the display 430 to display data output from the memory controller 420, data output from the radio transceiver 440, or data output from the input device 450. The memory controller 420, which controls the operations of the semiconductor memory device 100, may be a part of the host 410 or a separate chip.

Figure 14:
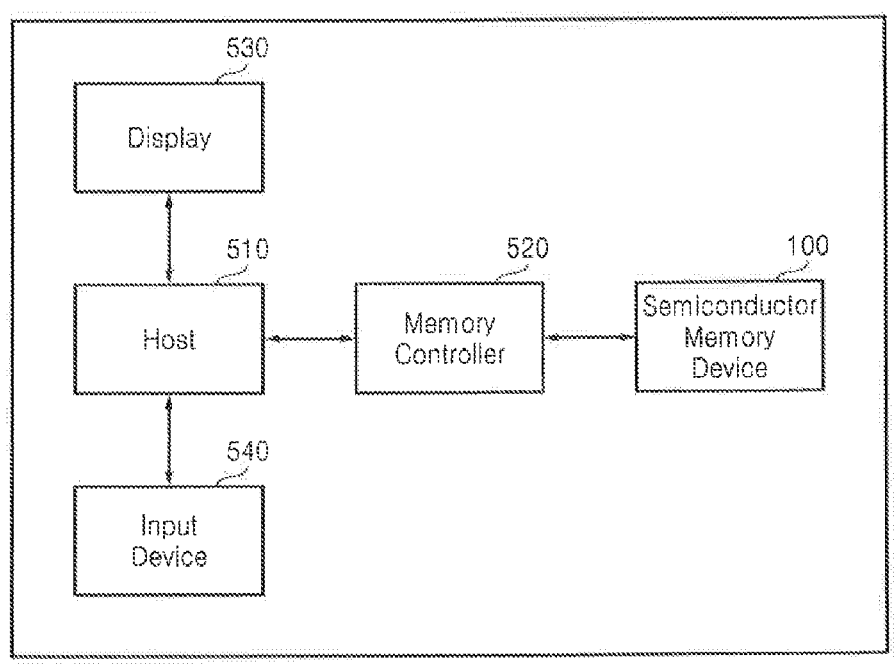
FIG. 14 is a block diagram of a computer system including the semiconductor memory device illustrated in FIG. 1 according to an exemplary embodiment of the inventive concept.

FIG. 14 is a block diagram of a computer system 500 including the semiconductor memory device 100 illustrated in FIG. 1 according to an exemplary embodiment of the inventive concept. The computer system 500 may be a PC, a tablet PC, a netbook, an e-reader, a PDA, a portable multimedia player (PMP), an MP3 (MPEG Audio Layer-3) player, or an MP4 (MPEG Audio Layer-4) player.

The computer system 500 includes a host 510, the semiconductor memory device 100, a memory controller 520 for controlling the data processing operations of the semiconductor memory device 100, a display 530 and an input device 540.

The host 510 may display data stored in the semiconductor memory device 100 through the display 530 according to data input through the input device 540. The input device 540 may be a pointing device such as a touch pad or a computer mouse, a keypad, or a keyboard.

The host 510 may control the overall operation of the computer system 500 and the operations of the memory controller 520. The memory controller 520 may be the memory controller 300 illustrated in FIG. 1.

According to an exemplary embodiment of the inventive concept, the memory controller 520, which may control the operations of the semiconductor memory device 100, may be a part of the host 510 or a separate chip.

Figure 15:
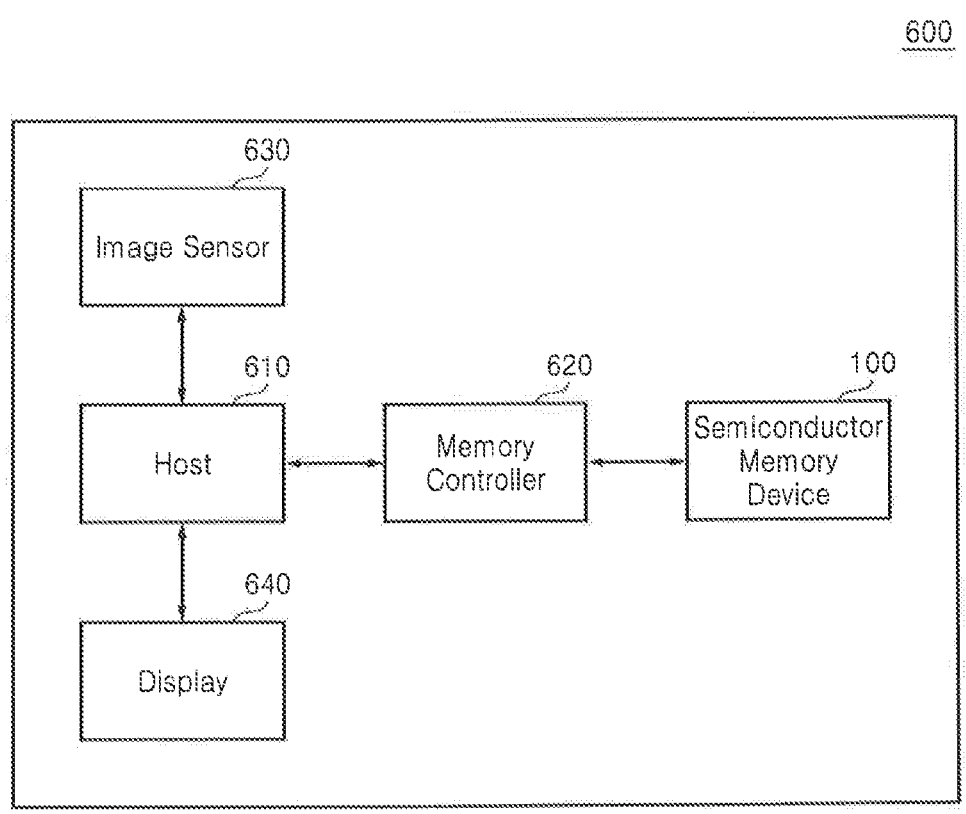
FIG. 15 is a block diagram of a computer system including the semiconductor memory device illustrated in FIG. 1 according to an exemplary embodiment of the inventive concept.

FIG. 15 is a block diagram of a computer system 600 including the semiconductor memory device 100 illustrated in FIG. 1 according to an exemplary embodiment of the inventive concept. The computer system 600 may be an image processing device such as a digital camera, a cellular phone equipped with a digital camera, or a smart phone equipped with a digital camera.

The computer system 600 includes a host 610, the semiconductor memory device 100 and a memory controller 620 for controlling the data processing operations, such as a write operation or a read operation, of the semiconductor memory device 100. The computer system 600 further includes an image sensor 630 and a display 640

The image sensor 630 included in the computer system 600 converts optical images into digital signals and outputs the digital signals to the host 610 or the memory controller 620. The digital signals may be controlled by the host 610 to be displayed through the display 640 or stored in the semiconductor memory device 100 through the memory controller 620.

Data stored in the semiconductor memory device 100 may be displayed through the display 640 according to the control of the host 610 or the memory controller 620. The memory controller 620, which may control the operations of the semiconductor memory device 100, may be a part of the host 610 or a separate chip.

Figure 16:
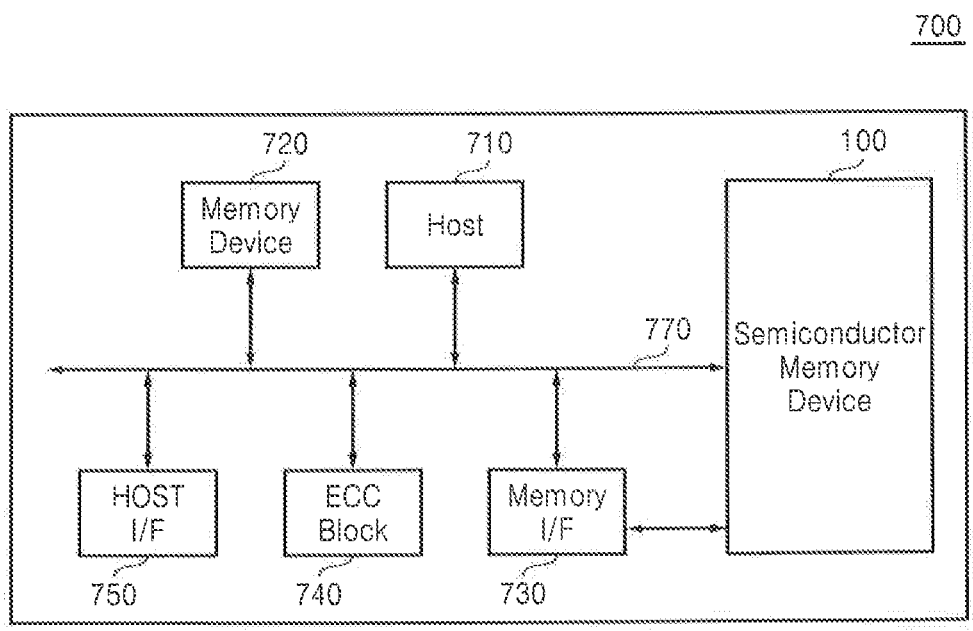
FIG. 16 is a block diagram of a computer system including the semiconductor memory device illustrated in FIG. 1 according to an exemplary embodiment of the inventive concept.

FIG. 16 is a block diagram of a computer system 700 including the semiconductor memory device 100 illustrated in FIG. 1 according to an exemplary embodiment of the inventive concept. The computer system 700 includes the semiconductor memory device 100 and a host 710 for controlling the operations of the semiconductor memory device 100.

The computer system 700 also includes a system memory 720, a memory interface 730, an error correction code (ECC) block 740, and a host interface 750.

The system memory 720 may be used as an operation memory of the host 710. The system memory 720 may be a non-volatile memory such as ROM or a volatile memory such as SRAM.

The host 710 connected with the computer system 700 may perform data communication with the semiconductor memory device 100 through the memory interface 730 and the host interface 750.

The ECC block 740 is controlled by the host 710 to detect an error bit included in data output from the semiconductor memory device 100 through the memory interface 730, correct the error bit, and transmit the error-corrected data to the host through the host interface 750. The host 710 may control data communication among the memory interface 730, the ECC block 740, the host interface 750, and the system memory 720 through a bus 770. The computer system 700 may be a flash memory drive, a universal serial bus (USB) memory drive, an interchip (IC)-USB memory drive, or a memory stick.

Figure 17:
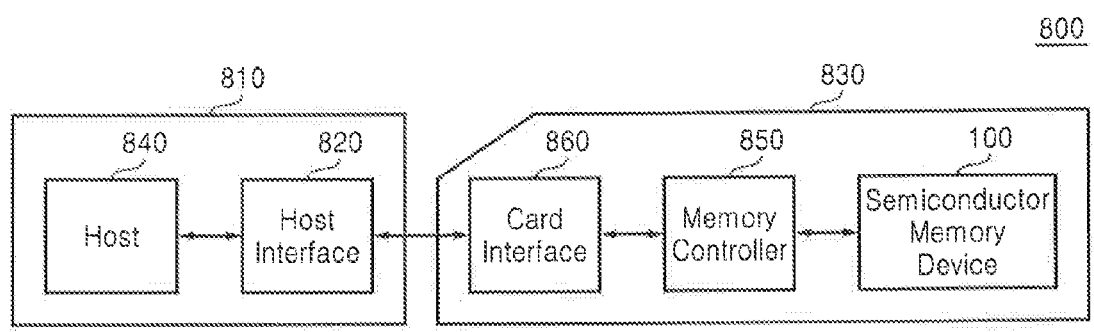
FIG. 17 is a block diagram of a computer system including the semiconductor memory device illustrated in FIG. 1 according to an exemplary embodiment of the inventive concept.

FIG. 17 is a block diagram of a computer system 800 including the semiconductor memory device 100 illustrated in FIG. 1 according to an exemplary embodiment of the inventive concept. The computer system 800 may be a host computer 810 and a memory card or a smart card 830. The computer system 800 includes the host computer 810 and the memory card 830.

The host computer 810 includes a host 840 and a host interface 820. The memory card 830 includes the semiconductor memory device 100, a memory controller 850, and a card interface 860. The memory controller 850 may control data exchange between the semiconductor memory device 100 and the card interface 860. The memory controller 850 may be the memory controller 300 illustrated in FIG. 1.

According to an exemplary embodiment of the inventive concept, the card interface 860 may be a secure digital (SD) card interface or a multi-media card (MMC) interface, but the inventive concept is not restricted to the current embodiment.

When the memory card 830 is installed into the host computer 810, the card interface 860 may interface the host 840 and the memory controller 850 for data exchange according to a protocol of the host 840. The card interface 860 may support a USB protocol and an IC-USB protocol. Here, the card interface 860 may indicate hardware supporting a protocol used by the host 330, software installed in the hardware, or a signal transmission mode.

When the computer system 800 is connected with the host interface 820 of the host computer 810 such as a PC, a tablet PC, a digital camera, a digital audio player, a cellular phone, a console video game hardware, or a digital set-top box, the host interface 820 may perform data communication with the semiconductor memory device 100 through the card interface 860 and the memory controller 850 according to the control of the host 840.

Figure 18:
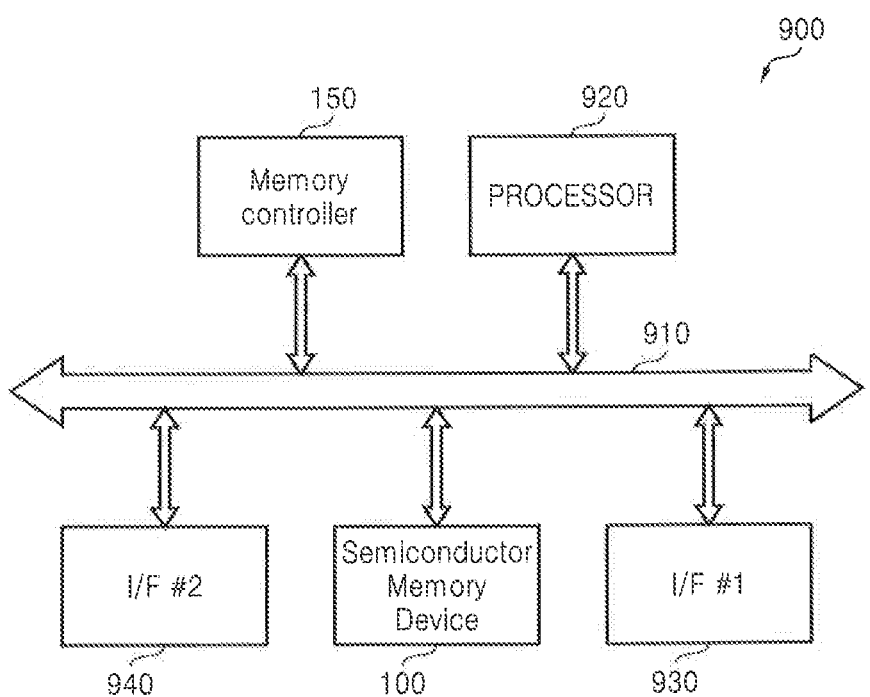
FIG. 18 is a block diagram of a computer system including the semiconductor memory device illustrated in FIG. 1 according to an exemplary embodiment of the inventive concept.

FIG. 18 is a block diagram of a computer system 900 including the semiconductor memory device 100 illustrated in FIG. 1 according to an exemplary embodiment of the inventive concept. The computer system 900 may include the semiconductor memory device 100, a memory controller 150, a processor 920, a first interface 930 and a second interface 940 which are connected to a data bus 910.

According to an exemplary embodiment of the inventive concept, the computer system 900 may include a portable device such as a mobile phone, an MP3 player, or an MP4 player, a PDA, or a PMP.

According to an exemplary embodiment of the inventive concept, the computer system 900 may include a data processing system such as a PC, a notebook-sized PC or a laptop computer.

According to an exemplary embodiment of the inventive concept, the computer system 900 may include a memory card such as an SD card or an MMC.

According to an exemplary embodiment of the inventive concept, the computer system 900 may include a smart card or a solid state drive (SSD).

The semiconductor memory device 100, the memory controller 150 and the processor 920 may be on one chip, for example, a SOC or separate devices.

According to an exemplary embodiment of the inventive concept, the processor 920 may process data input through the first interface 930 and write the data to the semiconductor memory device 100.

According to an exemplary embodiment of the inventive concept, the processor 920 may read data from the semiconductor memory device 100 and output the data through the first interface 930. In this case, the first interface 930 may be an input/output device.

The second interface 940 may be a wireless interface for wireless communication.

According to an exemplary embodiment of the inventive concept, the second interface 940 may be implemented by software or firmware.

Figure 19:
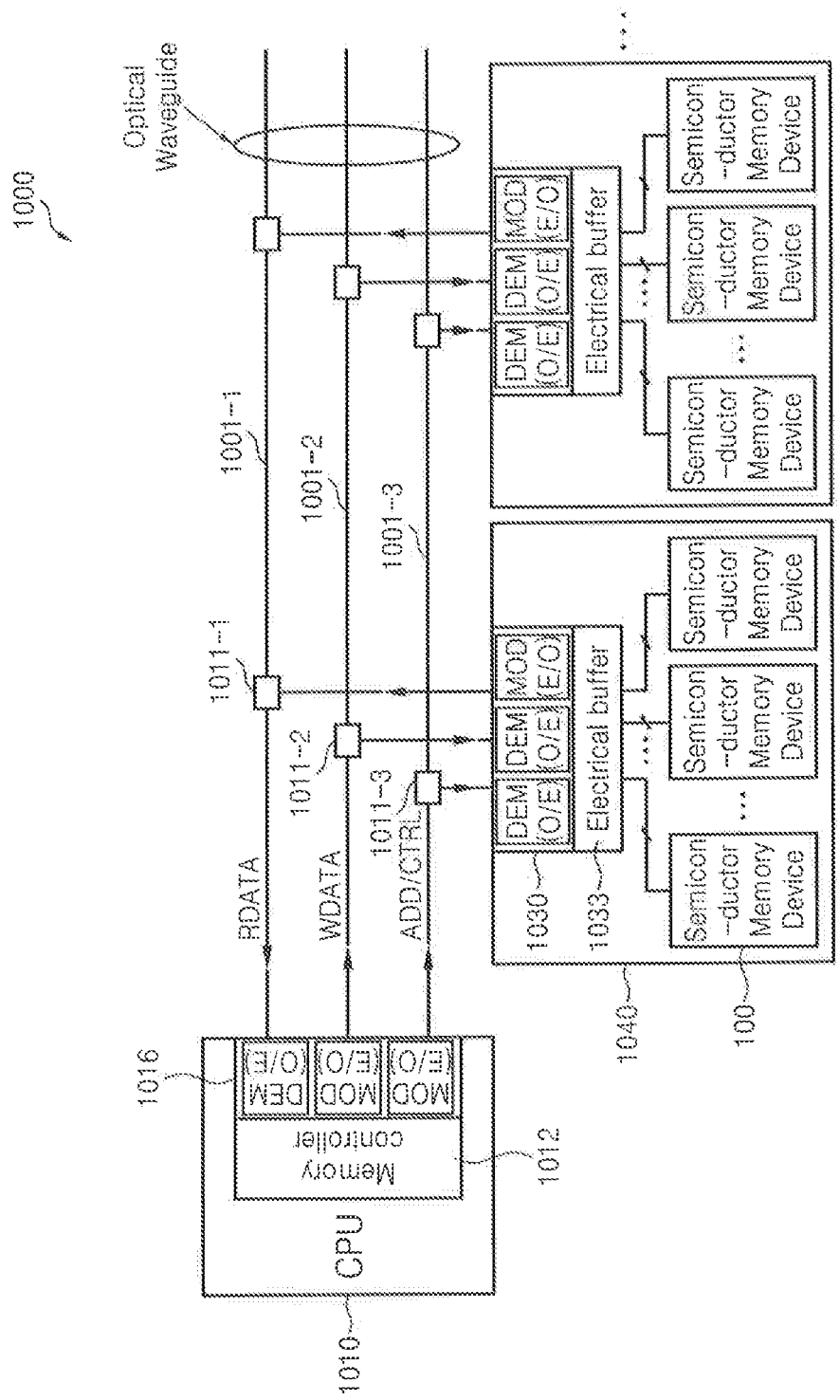
FIG. 19 is a block diagram of a data processing system including the semiconductor memory device illustrated in FIG. 1 according to an exemplary embodiment of the inventive concept.

FIG. 19 is a block diagram of a data processing system 1000 including the semiconductor memory device 100 illustrated in FIG. 1 according to an exemplary embodiment of the inventive concept. In FIG. 19, MOD(E/O) denotes an optical modulator used as an E/O converter which converts an electrical signal to an optical signal, and DEM(O/E) denotes an optical demodulator used as an O/E converter which converts an optical signal to an electrical signal. Referring to FIG. 19, the data processing system 1000 includes a central processing unit (CPU) 1010, a plurality of data buses 1001-1, 1001-2, and 1001-3, and a plurality of memory modules 1040.

Each of the memory modules 1040 may transmit and receive optical signals through a plurality of couplers 1011-1, 1011-2, and 1011-3 respectively connected to the data buses 1001-1 through 1001-3. According to an exemplary embodiment of the inventive concept, each of the couplers 1011-1 through 1011-3 may be an electrical coupler or an optical coupler.

The CPU 1010 includes a first optical transceiver 1016, which includes at least one optical modulator MOD(E/O) and at least one optical demodulator DEM(O/E), and a memory controller 1012. The optical demodulator DEM(O/E) is used as an O/E converter. The memory controller 1012 is controlled by the CPU 1010 to control the operations, e.g., the transmitting operation and the receiving operation, of the first optical transceiver 1016.

For instance, during a write operation, a first optical modulator MOD(E/O) of the first optical transceiver 1016 generates a modulated optical signal ADD/CTRL from addresses and control signals and transmits the optical signal ADD/CTRL to the optical communication bus 1001-3 in compliance with the memory controller 1012.

After the first optical transceiver 1016 transmits the optical signal ADD/CTRL to the optical communication bus 1001-3, a second optical modulator MOD(E/O) of the first optical transceiver 1016 generates modulated optical write data WDATA and transmits the optical write data WDATA to the data bus 1001-2.

Each of the memory modules 1040 includes a second optical transceiver 1030 and a plurality of memory devices 100. Each memory module 1040 may be an optical dual in-line memory module (DIMM), an optical fully buffered DIMM, an optical small outline dual in-line memory module (SO-DIMM), an optical registered DIMM (RDIMM), an optical load reduced DIMM (LRDIMM), an optical unbuffered DIMM (UDIMM), an optical micro DIMM, or an optical single in-line memory module (SIMM).

Referring to FIG. 19, an optical demodulator DEM(O/E) included in the second optical transceiver 1030 demodulates the optical write data WDATA received through the data bus 1001-2 and transmits a demodulated electrical signal to at least one of the memory devices 100.

Each memory module 1040 may also include an electrical buffer 1033 which buffers an electrical signal output from an optical demodulator DEM(O/E). For instance, the electrical buffer 1033 may buffer a demodulated electrical signal and transmit the buffered electrical signal to at least one of the memory devices 100.

During a read operation, an electrical signal output from the memory device 100 is modulated into optical read data RDATA by an optical modulator MOD(E/O) included in the second optical transceiver 1030. The optical read data RDATA is transmitted to a first optical demodulator DEM(O/E) included in the CPU 1010 through the data bus 1001-1. The first optical demodulator DEM(O/E) demodulates the optical read data RDATA and transmits a demodulated electrical signal to the memory controller 1012.

Figure 20:
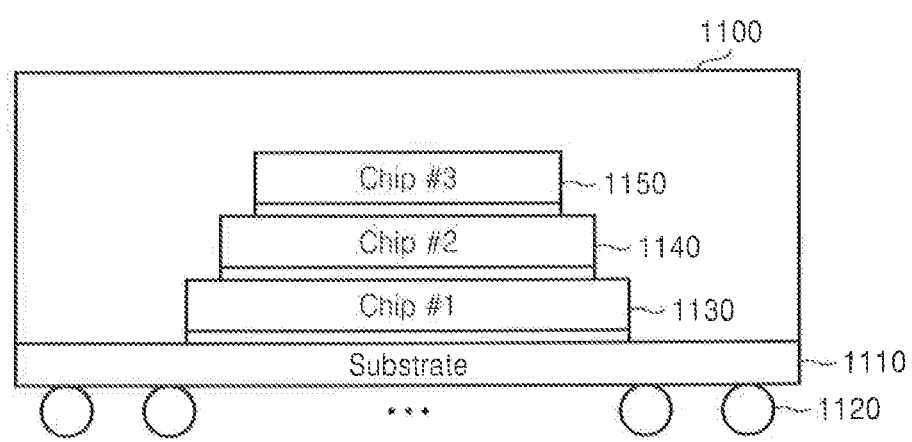
FIG. 20 is a schematic diagram of a multi-chip package including the semiconductor memory device illustrated in FIG. 1, according to an exemplary embodiment of the inventive concept.

FIG. 20 is a schematic diagram of a multi-chip package 1100 including the semiconductor memory device 100 illustrated in FIG. 1, according to an exemplary embodiment of the inventive concept. Referring to FIGS. 1 and 20, the multi-chip package 1100 may include a plurality of semiconductor devices, e.g., first through third chips 1130, 1140, and 1150 which are sequentially stacked on a package substrate 1110. Each of the semiconductor devices 1130 through 1150 may include the semiconductor memory device 100. A memory controller (not shown) for controlling the operations of the semiconductor devices 1130 through 1150 may be included within at least one of the semiconductor devices 1130 through 1150 or may be disposed on the package substrate 1110. A through-silicon via (TSV) (not shown), a bonding wire (not shown), a bump (not shown), or a solder ball 1120 may be used to electrically connect the semiconductor devices 1130 through 1150 with one other. The memory controller (not shown) may be the memory controller 300 illustrated in FIG. 1.

For one example, the first semiconductor device 1130 may be a logic die including an input/output interface and a memory controller, and the second and third semiconductor devices 1140 and 1150 may be a die, on which a plurality of memory devices are stacked, and may include a memory cell array. At this time, a memory device of the second semiconductor device 1140 and a memory device of the third semiconductor device 1150 may be the same or different types of memory.

Alternatively, each of the first through third semiconductor devices 1130 through 1150 may include a memory controller. At this time, the memory controller may be on the same die as a memory cell array or may be on a different die than the memory cell array.

As another alternative, the first semiconductor device 1130 may include an optical interface. A memory controller may be positioned in the first or second semiconductor device 1130 or 1140 and a memory device may be positioned in the second or third semiconductor device 1140 or 1150. The memory device may be connected with the memory controller through a TSV.

The multi-chip package 1100 may be implemented using a hybrid memory cube (HMC) in which a memory controller and a memory cell array die are stacked. When the HMC is used, the performance of memory devices increases due to the increase of bandwidth, and the area of the memory devices is minimized. As a result, power consumption and manufacturing cost can be reduced.

Figure 21:
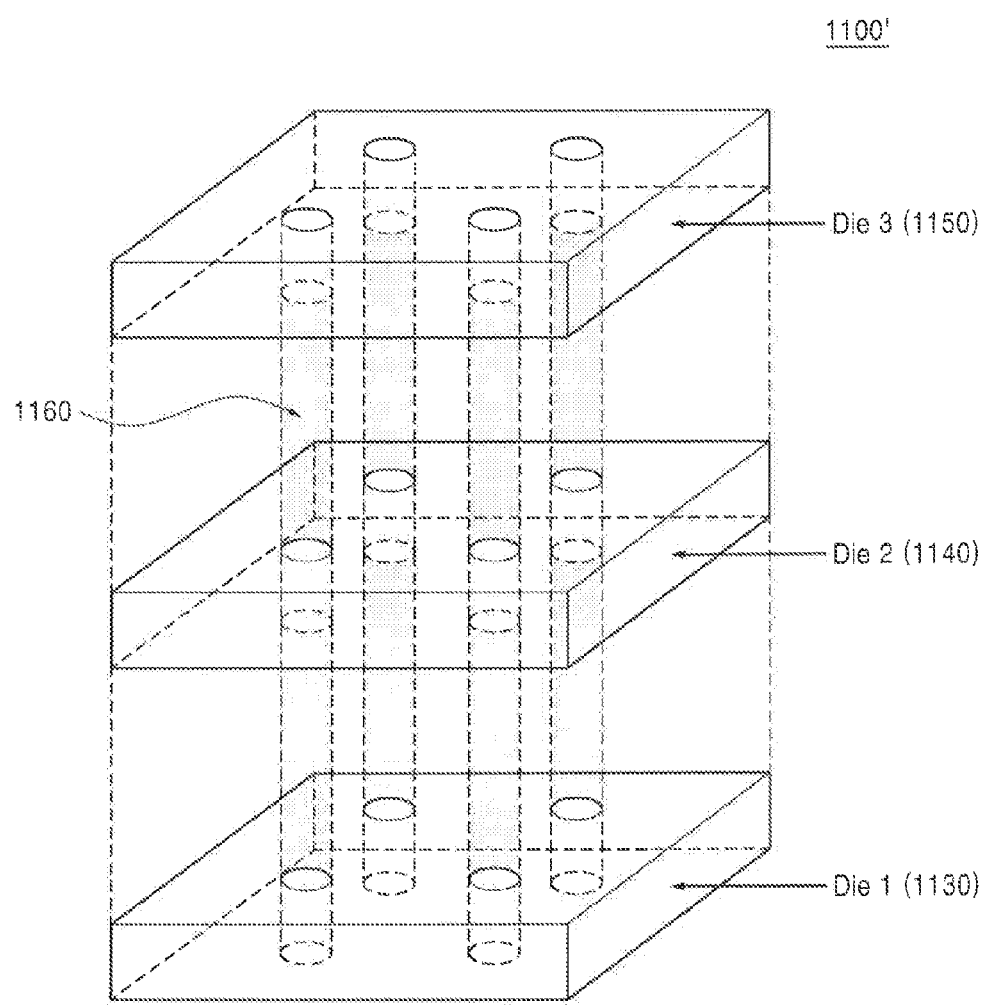
FIG. 21 is a three-dimensional diagram of an exemplary embodiment of the multi-chip package illustrated in FIG. 20.

FIG. 21 is a three-dimensional diagram of an exemplary embodiment 1100' of the multi-chip package 1100 illustrated in FIG. 20. Referring to FIG. 21, the multi-chip package 1100' includes a plurality of the dies 1130 through 1150 connected with one another through TSVs 1160 in a stack structure. Each of the dies 1130 through 1150 may include a plurality of circuit blocks (not shown) and a periphery circuit to realize the functions of the semiconductor memory device 100. The dies 1130 through 1150 may be referred to as a cell array. The plurality of circuit blocks may be memory blocks.

The TSVs 1160 may be formed of a conductive material including a metal such as copper (Cu). The TSVs 1160 are arranged at the center of a silicon substrate. The silicon substrate surrounds the TSVs 1160. An insulating region (not shown) may be disposed between the TSVs 1160 and the silicon substrate.

As described above, when a semiconductor memory device according to an exemplary embodiment of the inventive concept is used, a VOH is adjusted to be constant in each die, so that signal integrity can be increased.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A semiconductor memory device, comprising:
a ZQ calibration unit configured to generate an output high level voltage (VOH) code according to a VOH control code obtained from a result of comparing a reference voltage with a first VOH, wherein the reference voltage is calibrated according a VOH difference between different memory devices; and
an output driver configured to generate a data signal having a second VOH determined by the VOH code,
wherein the VOH control code comprises a pull-up VOH control code and a pull-down VOH control code and the VOH code comprises a pull-up VOH code and a pull-down VOH code.

2. The semiconductor memory device of claim 1, wherein the ZQ calibration unit comprises:
a first calibration unit configured to generate the pull-up VOH code, which determines a current generated by a pull-up driver included in the output driver, based on a first target VOH determined by the pull-up VOH control code; and
a second calibration unit configured to generate the pull-down VOH code, which determines a resistance of a pull-down driver included in the output driver, based on a second target VOH determined by the pull-down VOH control code.

3. The semiconductor memory device of claim 2, wherein the first calibration unit comprises:
a pull-up VOH control block configured to generate the first target VOH;
a first comparator configured to output a first comparison result by comparing the first target VOH with a voltage of a first node;
a first code generator configured to generate the pull-up VOH code based on the first comparison result;
a replica pull-up driver configured to generate a first current flowing across the first node according to the pull-up VOH code; and
a replica system on chip (SOC) on die termination (ODT) resistor configured to determine the voltage of the first node according to the first current.

4. The semiconductor memory device of claim 3, wherein the second calibration unit comprises:
a pull-down VOH control block configured to generate the second target VOH;
a second comparator configured to output a second comparison result by comparing the second target VOH with a voltage of a second node;
a second code generator configured to generate the pull-down VOH code based on the second comparison result; and
a replica pull-down driver configured to determine the voltage of the second node according to the pull-down VOH code.

5. The semiconductor memory device of claim 4, wherein the replica SOC ODT resistor has a resistance determined by the pull-down VOH code.

6. The semiconductor memory device of claim 5, wherein the voltage of the second node is determined by a resistor outside the semiconductor memory device and the replica pull-down driver.

7. The semiconductor memory device of claim 1, wherein the VOH control code is generated by an internal test mode signal of the semiconductor memory device or a VOH change request signal provided from outside the semiconductor memory device.

8. The semiconductor memory device of claim 1, further comprising a pre-driver configured to generate a pull-up driving signal and a pull-down driving signal according to the VOH code and internal data,
wherein the output driver comprises a pull-up driver configured to generate a current determined by the pull-up driving signal and a pull-down driver configured to have a resistance determined by the pull-down driving signal.

9. A semiconductor memory device, comprising:
a data output circuit configured to perform ZQ calibration according to an output high level voltage (VOH) change request signal or a test mode signal and output a data signal whose VOH has been changed,
the data output circuit including a ZQ calibration control unit configured to generate a VOH control code corresponding to information of the VOH change request signal or the test mode signal, the information indicating whether to increase or decrease the VOH, wherein the information of the VOH change request signal or the test mode signal is indicative of a difference between a first reference voltage of a first memory device and a second reference voltage of a second memory device exceeding a first threshold.

10. The semiconductor memory device of claim 9, wherein the data signal is output from a DQ terminal.

11. The semiconductor memory device of claim 10, wherein the VOH change request signal is generated by a memory controller configured to receive the data signal output from the DQ terminal.

12. The semiconductor memory device of claim 9, wherein the data output circuit further comprises a ZQ calibration unit configured to generate a pull-up VOH code or a pull-down VOH code in response to the VOH control code.

13. The semiconductor memory device of claim 12, wherein the data output circuit further comprises a pre-driver configured to generate a pull-up driving signal and a pull-down driving signal in response to the pull-up VOH code, the pull-down VOH code and data.

* * * * *